US012635370B2

(12) United States Patent
Cheon et al.

(10) Patent No.: US 12,635,370 B2
(45) Date of Patent: May 19, 2026

(54) DISPLAY DEVICE INCLUDING DATA LINES AND POWER LINES THEREBETWEEN

(71) Applicant: Samsung Display Co., LTD., Yongin-si (KR)

(72) Inventors: Soo Hong Cheon, Seoul (KR); Hyung Jin Song, Hwaseong-si (KR); Seong Young Lee, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 716 days.

(21) Appl. No.: 17/572,603

(22) Filed: Jan. 10, 2022

(65) Prior Publication Data

US 2022/0328612 A1 Oct. 13, 2022

(30) Foreign Application Priority Data

Apr. 9, 2021 (KR) ........................ 10-2021-0046317

(51) Int. Cl.
*H10K 59/131* (2023.01)

(52) U.S. Cl.
CPC ................................ *H10K 59/1315* (2023.02)

(58) Field of Classification Search
CPC ............. H10K 59/1315; H10K 59/131; H10K 59/179; H10K 59/82; H01L 27/124; G09G 2300/0426
See application file for complete search history.

(56) References Cited

U.S. PATENT DOCUMENTS

| | | | |
|---|---|---|---|
| 11,545,088 B2 | 1/2023 | Xu et al. | |
| 2017/0169760 A1* | 6/2017 | Kim ...................... | G09G 3/2003 |
| 2017/0345877 A1* | 11/2017 | Hwang ................ | H10K 59/131 |
| 2019/0027092 A1* | 1/2019 | Matsueda ............ | H10K 59/131 |
| 2019/0131589 A1* | 5/2019 | Matsueda ............ | H10K 59/131 |
| 2021/0358407 A1* | 11/2021 | Xu ...................... | H10K 59/1216 |

FOREIGN PATENT DOCUMENTS

| | | |
|---|---|---|
| CN | 208173203 U | 11/2018 |
| KR | 1020160038494 | 4/2016 |

* cited by examiner

*Primary Examiner* — Chad M Dicke
*Assistant Examiner* — Jeremy Daniel Watts
(74) *Attorney, Agent, or Firm* — CANTOR COLBURN LLP

(57) ABSTRACT

A display device includes a substrate, a first data line, a second data line and a third data line on the substrate, each of the first to third data lines being extend in a first direction and arranged in a second direction crossing the first direction, a first power line which is between the first data line and the second data line on the substrate, extends in the first direction, and supplies a first supply voltage, and a second power line which is between the second data line and the third data line on the substrate, extends in the first direction, and supplies a second supply voltage equal to the first supply voltage.

13 Claims, 14 Drawing Sheets

FIG. 2

CFL : CFL1, CFL2, CFL3
WCL : WCL1, WCL2
EMD: PXE, EML, CME

160: 161, 162, 163
170: 171, 172
100: 110, 120, 130, 140, 150, 160, 170
ACTL: ACT1, ACT2, ACT3, ACT4, ACT5,
ACT6, ACT7, ACT8

160_1: 161, 162_1, 163
170: 171, 172
100_1: 110, 120, 130, 140, 150, 160_1, 170
ACTL_1: ACT1_1, ACT2_1, ACT3, ACT4_1,
ACT5, ACT6, ACT7_1, ACT8

200_1: 210_1, 220_1, 230_1, 240, 250
210_1: 211, 212_1, 213
220_1: 221, 222_1, 223
230_1: 231, 232_1, 233
240: 241, 242

300_1: 310, 320, 330_1, 340, 350_1, 360_1, 370_1, 380_1
310: 311, 312
330_1: 331, 332_1, 333
350_1: 351, 352_1, 353
360_1: 361, 362_1, 363
370_1: 371, 372_1, 373
380_1: 381, 382_1, 383

DISPLAY DEVICE INCLUDING DATA LINES AND POWER LINES THEREBETWEEN

This application claims priority to Korean Patent Application No. 10-2021-0046317 filed on Apr. 9, 2021, and all the benefits accruing therefrom under 35 U.S.C. § 119, the content of which in its entirety is herein incorporated by reference.

BACKGROUND

1. Field

Embodiments of the invention relate to a display device.

2. Description of the Related Art

As an information-oriented society evolves, various demands for display devices are ever increasing. The display devices are being employed by a variety of electronic devices such as smart phones, digital cameras, laptop computers, navigation devices, and smart televisions.

The display devices include a light-receiving display device such as a liquid-crystal display device, a field emission display device, and a light-emitting display device, an organic light-emitting display device including an organic light-emitting element, an inorganic light-emitting display device including an inorganic light-emitting element such as an inorganic semiconductor, and a light-emitting display device such as a micro-light-emitting display device including a micro-light-emitting element.

An organic light-emitting display device includes thin-film transistors ("TFTs"), lines connected thereto, and organic light-emitting elements that are driven by the TFTs to reproduce images. In order to improve the luminous efficiency of organic light-emitting display devices, there is an attempt to increase an area of the openings exposing the pixel electrodes.

SUMMARY

Features of the invention provide a display device which includes sub-pixels arranged in a stripe pattern and has improved luminous efficiency by way of increasing the area of openings exposing pixel electrodes.

It should be noted that features of the invention are not limited to the above-mentioned object, and other features of the invention will be apparent to those skilled in the art from the following descriptions.

In an embodiment of the invention, a display device includes a substrate, a first data line, a second data line and a third data line on the substrate, each the first to third data lines extending in a first direction and arranged in a second direction crossing the first direction, a first power line which is between the first data line and the second data line on the substrate, extends in the first direction, and supplies a first supply voltage, and a second power line between the second data line and the third data line on the substrate, extended in the first direction, and supplying a second supply voltage equal to the first supply voltage.

In an embodiment, a first distance from the second power line to the second data line in the second direction may be equal to a second distance from the second power line to the third data line in the second direction.

In an embodiment, a third distance from the first power line to the first data line in the second direction may be equal to the first distance.

In an embodiment, a fourth distance from the first power line to the second data line in the second direction may be greater than the first distance.

In an embodiment, the display device may further include a semiconductor layer including a plurality of semiconductor patterns disposed on the substrate, a first conductive layer on the semiconductor layer and including a plurality of gate electrodes at least partially overlapping some of the plurality of semiconductor patterns, and a second conductive layer on the first conductive layer and including the first data line, the second data line, the third data line, the first power line and the second power line.

In an embodiment, the first data line, the second data line and the third data line may be arranged adjacent to each other in order. The first data line, the second data line and the third data line may partially overlap some of the plurality of semiconductor patterns.

In an embodiment, the plurality of semiconductor patterns may include a first semiconductor pattern partially overlapping the first data line, and a second semiconductor pattern partially overlapping the second data line and the third data line. The first semiconductor pattern may partially overlap the first power line. The second semiconductor pattern may partially overlap the second power line.

In an embodiment, the plurality of gate electrodes may include a first gate electrode in a direction opposite to the first direction of the first data line, a second gate electrode between the first data line and the second data line, and a third gate electrode in the first direction of the second data line.

In an embodiment, a first separation distance between the second gate electrode and the second power line in the second direction in a plan view may be equal to a second separation distance between the third gate electrode and the second power line in the second direction in the plan view.

In an embodiment, a third separation distance between the first gate electrode and the first power line in the second direction may be equal to the first separation distance in the plan view.

In an embodiment, the display device may further include a plurality of pixel electrodes on the second conductive layer. The plurality of pixel electrodes may include a first pixel electrode partially overlapping the first gate electrode, a second pixel electrode partially overlapping the second gate electrode, and a third pixel electrode partially overlapping the third gate electrode.

In an embodiment, the second supply voltage from the second power line may be applied to the second pixel electrode and the third pixel electrode. The first supply voltage from the first power line may be applied to the first pixel electrode.

In an embodiment, the display device may further include a power line on the substrate on a side opposite to the first power line with the first data line therebetween. A third supply voltage lower than the first supply voltage may be applied to the power line.

In an embodiment of the invention, a display device includes a substrate, a first power line on the substrate and extended in a first direction, a first data line in a second direction crossing the first direction of the first power line, and a second data line in a direction opposite to the second direction of the first power line. A first distance between the first data line and the first power line in the second direction is equal to a second distance between the second data line and the first power line in the second direction.

In an embodiment, the display device may further include a first conductive layer on the substrate. The first conductive layer may include a first gate electrode on a side opposite to the first power line with the first data line therebetween in a plan view, and a second gate electrode on a side opposite to the first power line with the second data line therebetween in the plan view. A separation distance between the first gate electrode and the first power line in the second direction may be equal to a separation distance between the second gate electrode and the first power line in the second direction in the plan view.

In an embodiment, the display device may further include a semiconductor layer on the substrate and including a semiconductor pattern partially overlapping with the first power line. The first conductive layer may be disposed on the semiconductor layer. The semiconductor pattern may partially overlap the first gate electrode and the second gate electrode.

In an embodiment, the semiconductor pattern may partially overlap the first data line and the second data line.

In an embodiment, the display device may further include a second power line on a side opposite to the first data line with the first gate electrode therebetween and extended in the first direction, and a third data line on a side opposite to the first gate electrode with the second power line therebetween and extended in the first direction. A third distance between the third data line and the second power line in the second direction may be equal to the first distance.

In an embodiment, the first conductive layer may further include a third gate electrode on a side opposite to the second power line with the third data line therebetween. A separation distance between the third gate electrode and the second power line in the second direction may be equal to a separation distance between the first gate electrode and the first power line in the second direction in the plan view.

In an embodiment, the display device may further include a second conductive layer on the first conductive layer. The second conductive layer may include the first power line, the first data line, and the second data line.

In an embodiment of the invention, a display device which includes sub-pixels arranged in a stripe pattern may improve luminous efficiency by way of increasing the area of openings exposing pixel electrodes.

It should be noted that effects of the invention are not limited to those described above and other effects of the invention will be apparent to those skilled in the art from the following descriptions.

BRIEF DESCRIPTION OF THE DRAWINGS

The above and other advantages and features of the invention will become more apparent by describing in detail embodiments thereof with reference to the attached drawings, in which:

FIG. 2 is an enlarged view of area Q of FIG. 1.

FIGS. 6 to 8 are plan views showing some of the plurality of lines of FIG. 5, respectively.

FIG. 10 is a cross-sectional view taken along line X-X' of FIG. 5.

DETAILED DESCRIPTION

Figure 1:
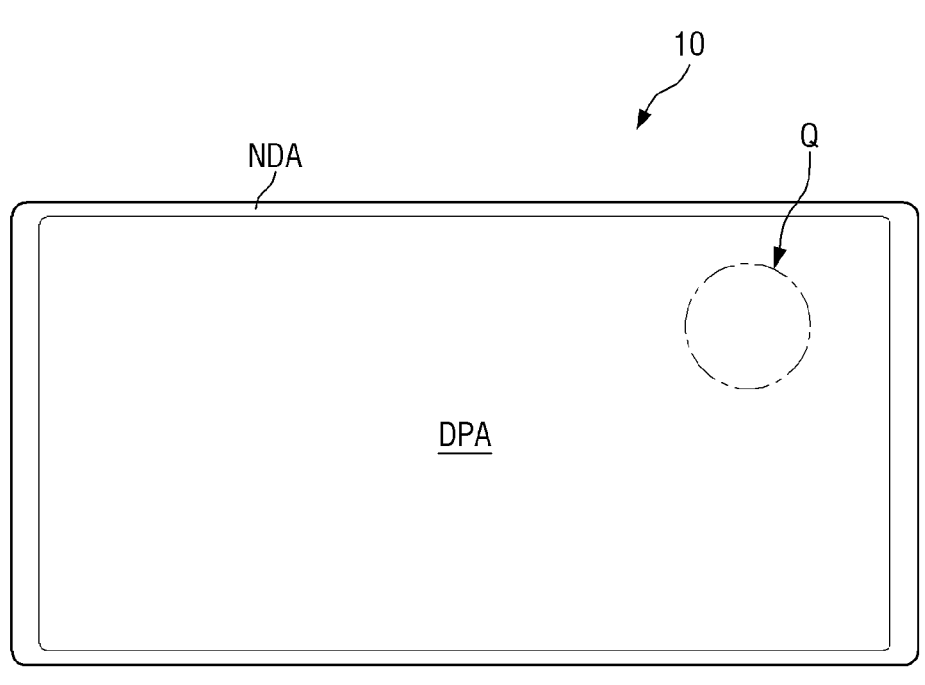
FIG. 1 is a plan view of an embodiment of a display device according to the invention.
Figure 1:
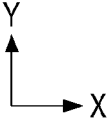

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the disclosure disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in other embodiments without departing from the disclosure.

Unless otherwise specified, the illustrated embodiments are to be understood as providing features of varying detail of some ways in which the disclosure may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Further, the X-axis, the Y-axis, and the Z-axis are not limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments are described herein with reference to cross-sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions may not reflect actual shapes of regions of a device and are not necessarily intended to be limiting.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the invention. Further, the blocks, units, parts, and/or modules of some embodiments may be physically combined into more complex blocks, units, parts, and/or modules without departing from the scope of the invention.

Unless otherwise defined or implied herein, all terms (including technical and scientific terms) used herein have the same meaning as commonly understood by one of ordinary skill in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or overly formal sense, unless clearly so defined herein.

Figure 2:
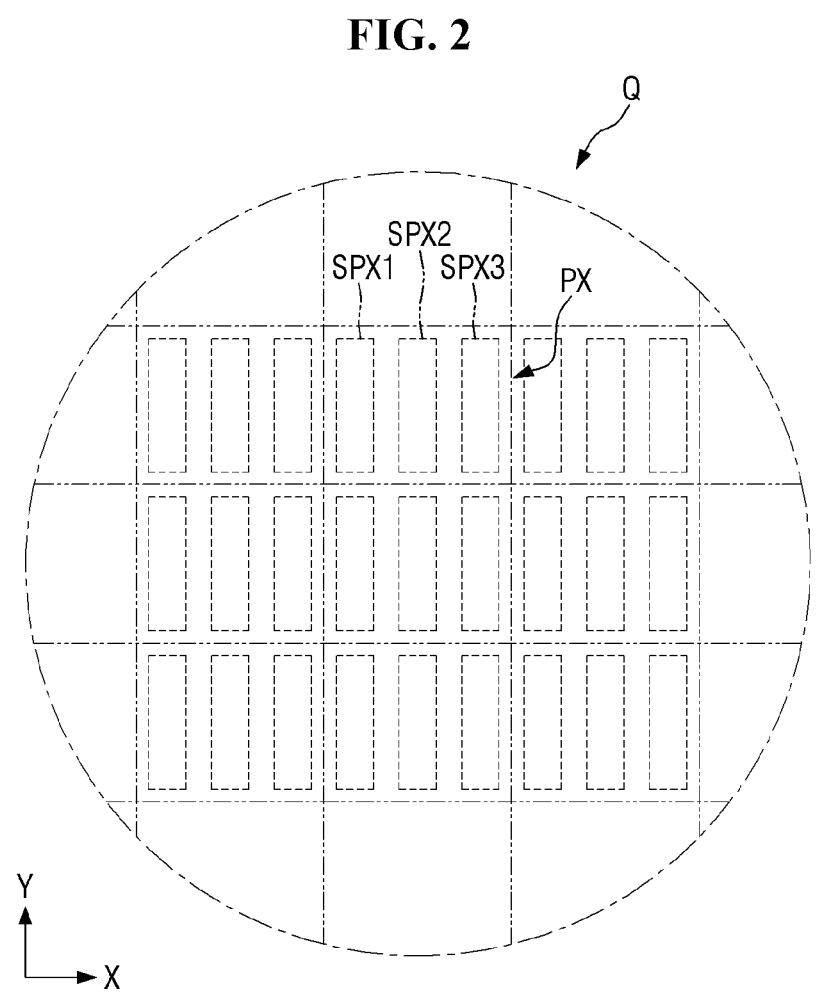

FIG. 1 is a plan view of an embodiment of a display device according to the invention. FIG. 2 is an enlarged view of area Q of FIG. 1.

Referring to FIG. 1, a display device 10 displays a moving image or a still image. A display device 10 may refer to any electronic device that provides a display screen. In an embodiment, the display device 10 may include a television set, a laptop computer, a monitor, an electronic billboard, the internet of things ("IoT") devices, a mobile phone, a smart phone, a tablet personal computer ("PC"), an electronic watch, a smart watch, a watch phone, a head-mounted display device, a mobile communications terminal, an electronic notebook, an electronic book, a portable multimedia player ("PMP"), a navigation device, a game console and a digital camera, a camcorder, etc., for example.

The display device 10 includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an organic light-emitting diode display panel is employed as an embodiment of the display panel, but the invention is not limited thereto. Any other display panel may be employed as long as the technical idea of the invention may be equally applied.

The shape of the display device 10 may be modified in a variety of ways. In an embodiment, the display device 10 may have shapes such as a rectangle with longer lateral sides, a rectangle with longer vertical sides, a square, a quadrangle with rounded corners (vertices), other polygons, a circle, etc., for example. The shape of a display area DPA of the display device 10 may also be similar to the overall shape of the display device 10. In the embodiment shown in FIG. 1, the display device 10 has a quadrangular (e.g., rectangular) shape with longer sides in a first direction X and shorter sides in a second direction Y.

The display device 10 may include a display area DPA and a non-display area NDA. In the display area DPA, images may be displayed. In the non-display area NDA, images are not displayed. The display area DPA may be also referred to as an active area, while the non-display area NDA may also be also referred to as an inactive area. The display area DPA may generally occupy the majority of the center of the display device 10.

The non-display area NDA may be disposed around the display area DPA. The non-display area NDA may surround the display area DPA entirely or partially. The display area DPA may have a quadrangular (e.g., rectangular) shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be disposed (e.g., mounted).

The display area DPA may include a plurality of pixels PX. Each of the pixels PX may include one or more light-emitting elements EMD (refer to FIG. 3) that emit light of particular wavelength bands to represent colors. The plurality of pixels PX may be arranged in a matrix. In an embodiment, the plurality of pixels PX may be arranged along the first direction X and the second direction Y, for example. The shape of each pixel PX may be, but is not limited to, a rectangle or a square in a plan view (e.g., top view). Each pixel may have a diamond shape having sides inclined with respect to a direction. In the following description, the pixels PX have a quadrangular (e.g., rectangular) shape in the plan view, but the invention is not limited thereto.

Each of the pixels PX may include a plurality of sub-pixels SPX1, SPX2 and SPX3. In each of the pixels PX, the plurality of sub-pixels SPX1, SPX2 and SPX3 may be arranged in a stripe pattern. The plurality of sub-pixels SPX1, SPX2 and SPX3 of each pixel PX may be arranged in a direction perpendicular to the direction in which they are extended. In an embodiment, the plurality of sub-pixels SPX1, SPX2 and SPX3 included in each pixel PX may be arranged in the first direction X and may have a shape extended in the second direction Y, for example.

Figure 3:
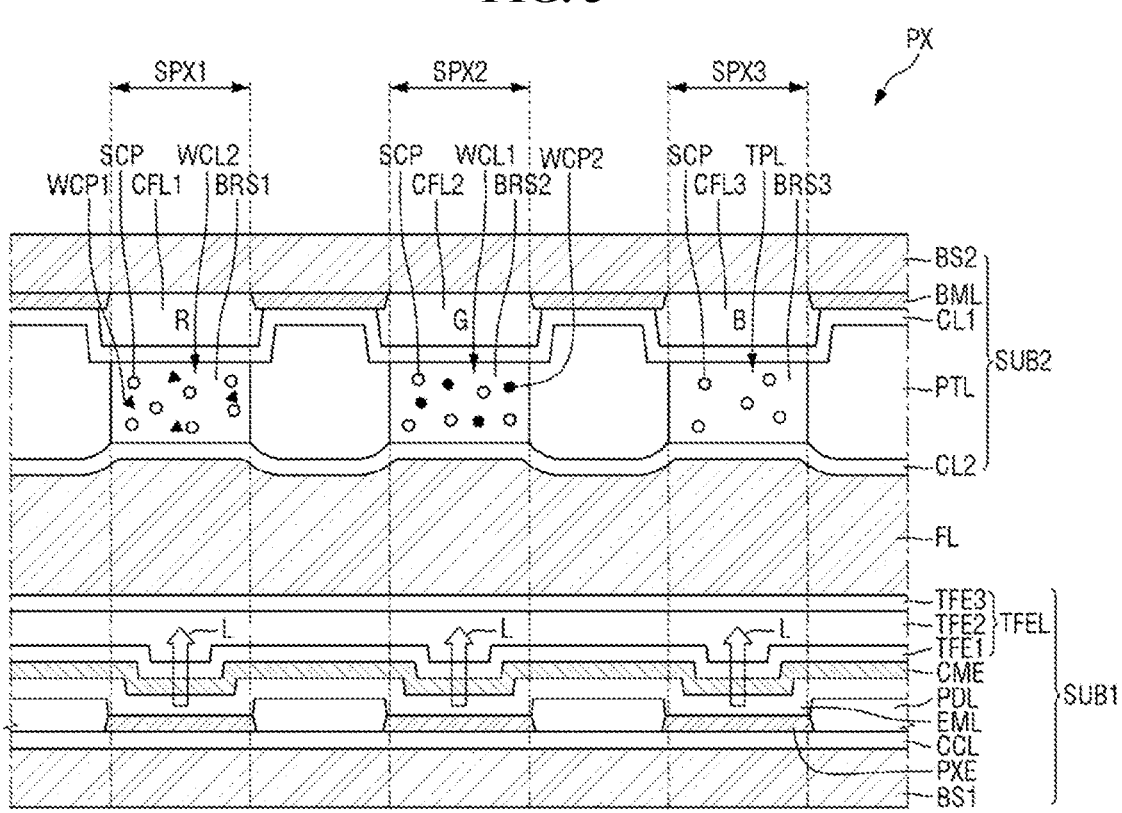
FIG. 3 is a cross-sectional view of an embodiment of a pixel of a display device according to the invention.

FIG. 3 is a cross-sectional view of an embodiment of a pixel of a display device according to the invention.

Although a top-emission display device is shown in the embodiment shown in FIG. 3, in which light L exits toward the side where a second base substrate BS2 is disposed, instead of a first base substrate BS1 where an emission material layer EML is formed or provided, the invention is not limited thereto. The display device 10 may be a bottom-emission or a double-sided display device. Although the display device 10 includes a first display substrate SUB1 including light-emitting elements EMD, a second display substrate SUB2 including wavelength conversion members, and a filling layer FL coupling them in the embodiment shown in FIG. 3, the invention is not limited thereto. In the display device 10, the light-emitting elements EMD and the wavelength conversion members may be formed on the same substrate.

Referring to FIG. 3, as described above, one pixel PX may include a plurality of sub-pixels SPX1, SPX2 and SPX3 arranged in one direction. The plurality of sub-pixels SPX1, SPX2 and SPX3 may include a first sub-pixel SPX1, a second sub-pixel SPX2 and a third sub-pixel SPX3. In an embodiment, the first sub-pixel SPX1 may emit a light of a first color, the second sub-pixel SPX2 may emit a light of a second color, and the third sub-pixel SPX3 may emit a light a third color, for example. However, it should be understood that the invention is not limited thereto.

The display device 10 may include the first display substrate SUB1, the second display substrate SUB2 opposed thereto, and the filling layer FL coupling them.

The first display substrate SUB1 may include a first base substrate BS1, a circuit layer CCL disposed on the first base substrate BS1, a light-emitting element EMD disposed on the circuit layer CCL, and an encapsulation structure TFEL disposed on the light-emitting element EMD.

The first base substrate BS1 of the first display substrate SUB1 may be an insulating substrate. The first base substrate BS1 may be a rigid substrate such as glass.

A plurality of pixel electrodes PXE may be disposed on the surface of the first base substrate BS1. The plurality of pixel electrodes PXE may be disposed in the pixels PX, respectively. A circuit layer CCL driving the pixels PX may be disposed on the first base substrate BS1. The circuit layer CCL may be disposed between the first base substrate BS1 and the pixel electrodes PXE. The circuit layer CCL will be described in detail later.

Each of the pixel electrodes PXE may be a first electrode, e.g., an anode electrode of a light-emitting diode. The pixel electrodes PXE may be disposed in the pixels PX, respectively.

In addition, a pixel-defining layer PDL may be disposed on the first base substrate BS1 along the boundary of the pixel PX. The pixel-defining layer PDL may be disposed over the pixel electrode PXE, and an opening exposing the pixel electrodes PXE may be defined in the pixel-defining layer PDL.

The emission material layer EML may be disposed on the pixel electrodes PXE exposed by the pixel-defining layer PDL. The emission material layer EML may include an organic, emissive layer and may further include hole injection/transport layers and/or electron injection/transport layers as auxiliary layers in some implementations to facilitate emission. The emission material layer EML may be entirely disposed across the pixels PX. In another embodiment where the display device 10 is a micro LED display device, a nano LED display device, etc., the emission material layer EML may include an inorganic material such as an inorganic semiconductor.

In an embodiment of the invention, the wavelength of light emitted from the emission material layer EML may be the same for different sub-pixel SPX1, SPX2 and SPX3. In an embodiment, in each of the sub-pixels SPX1, SPX2 and SPX3, the emission material layer EML emits blue light or ultraviolet light, and the second display substrate 200 includes a wavelength conversion layer WCL, for example, so that different pixels PX may represent lights of different colors.

In another embodiment, the wavelength of light emitted from the emission material layer EML may be different for different sub-pixels SPX1, SPX2 and SPX3. In an embodiment, the emission material layer EML of the first color pixel PX may emit the light of the first color, the emission material layer EML of the second color pixel PX may emit the light of the second color, and the emission material layer EML of the third color pixel PX may emit the light of the third color, for example.

A common electrode CME may be disposed on the emission material layer (also referred to as an emissive layer) EML. The common electrode CME may be extended across the pixels PX. The common electrode CME may be disposed on the entire surface across the pixels PX. The common electrode CME may be a second electrode of the light-emitting diode, i.e., a cathode electrode.

The pixel electrodes PXE, the emission material layer EML and the common electrode CME may form the light-emitting element EMD. Light emitted from the emission material layer EML may pass through the common electrode CME to exit upwardly.

The encapsulation structure (also referred to as a thin-film encapsulation structure) TFEL may be disposed on the common electrode CME. The thin-film encapsulation structure TFEL may include at least one thin-film encapsulation layer. In an embodiment, the thin-film encapsulation layer may include a first inorganic film TFE1, an organic film TFE2, and a second inorganic film TFE3, for example.

The second display substrate SUB2 may be disposed above the thin-film encapsulation structure TFEL to face it.

The second base substrate BS2 of the second display substrate SUB2 may include a transparent insulating material such as glass. The second base substrate BS2 may be a rigid substrate.

A light-blocking member BML may be disposed along the boundary of the pixel PX on a surface of the second base substrate BS2 which faces the first base substrate BS1. The light-blocking member BML may overlap the pixel-defining layer PDL of the first display substrate SUB1. The light-blocking member BML may be formed in a lattice pattern in the plan view and an opening exposing the surface of the second base substrate BS2 may be defined in the light-blocking member BML.

A color filter layer CFL may be disposed on the surface of the second base substrate BS2 on which the light-blocking member BML is disposed. The color filter layer CFL may be disposed on the surface of the second base substrate BS2 exposed through the opening of the light-blocking member BML.

The color filter layer CFL may include a first color filter layer CFL1 disposed in the first color pixel PX, a second color filter layer CFL2 disposed in the second color pixel PX, and a third color filter layer CFL3 disposed in the third color pixel PX. Each color filter layer CFL may include a colorant such as a dye and a pigment which absorb wavelengths other than the wavelength of the color it represents. The first color filter layer CFL1 may be a red color filter layer, the second color filter layer CFL2 may be a green color filter layer, and the third color filter layer CFL3 may be a blue color filter layer.

A first capping layer CL1 for preventing permeation of impurities such as moisture and air may be disposed on the color filter layer CFL.

A partition wall PTL may be disposed on the first capping layer CL1. The partition wall PTL may be disposed so that it overlaps the light-blocking member BML. An opening via which the color filter layer CFL is exposed may be defined in the partition wall PTL.

A wavelength conversion layer WCL or a transparent layer TPL may be disposed in the space exposed by the opening of the partition wall PTL. The wavelength conversion layer WCL and the transparent layer TPL may be formed by, but is not limited to, an inkjet process using the partition wall PTL as a bank.

The wavelength conversion layer WCL may include a first wavelength conversion pattern WCL1 disposed in the first color pixel PX, and a second wavelength conversion pattern WCL2 disposed in the second color pixel PX. The first wavelength conversion pattern WCL1 converts light of the third color incident from the emission material layer EML into light of the first color. The second wavelength conversion pattern WCL2 converts light of the third color incident from the emission material layer EML into light of the second color.

The first and second wavelength conversion patterns WCL1 and WCL2 may include base resins BRS1 and BRS2 and wavelength conversion materials WCP1 and WCP2 dispersed in the base resins BRS1 and BRS2, respectively. The base resins BRS1 and BRS2 may include a transparent organic material. In an embodiment, the wavelength conversion materials WCP1 and WCP2 may be quantum dots, quantum rods, phosphors, etc. In an embodiment, the quantum dots may include IV nanocrystals, II-VI compound nanocrystals, III-V compound nanocrystals, IV-VI nanocrystals, or combinations thereof.

The transparent layer TPL may be disposed in the third color pixel PX. The transparent layer TPL may include a base resin BRS3 and scatterers SCP dispersed therein. The transparent layer TPL may include no wavelength conversion material.

A second capping layer CL2 may be disposed on the wavelength conversion layers WCL and the transparent layer TPL.

The filling layer FL may be interposed between the first display substrate SUB1 and the second display substrate SUB2. The space between the first display substrate SUB1 and the second display substrate SUB2 may be filled with the filling layer FL, and they may be coupled with each other by the filling layer FL. The filling layer (also referred to as a filler layer) FL may be disposed between the thin-film encapsulation structure TFEL of the first display substrate SUB1 and the second capping layer CL2 of the second display substrate SUB2. In an embodiment, the filler layer FL may include, but is not limited to, a Si-based organic material, an epoxy-based organic material, etc.

Each of the pixels PX on the first base substrate BS1 includes a pixel driving circuit. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. In the following description, the pixel driving circuit having a 3T1C structure including three transistors and one capacitor will be described as an example. It is, however, to be understood that the invention is not limited thereto. A variety of modified pixel structure may be employed such as a 2T1C structure, a 7T1C structure and a 6T1C structure.

Figure 4:
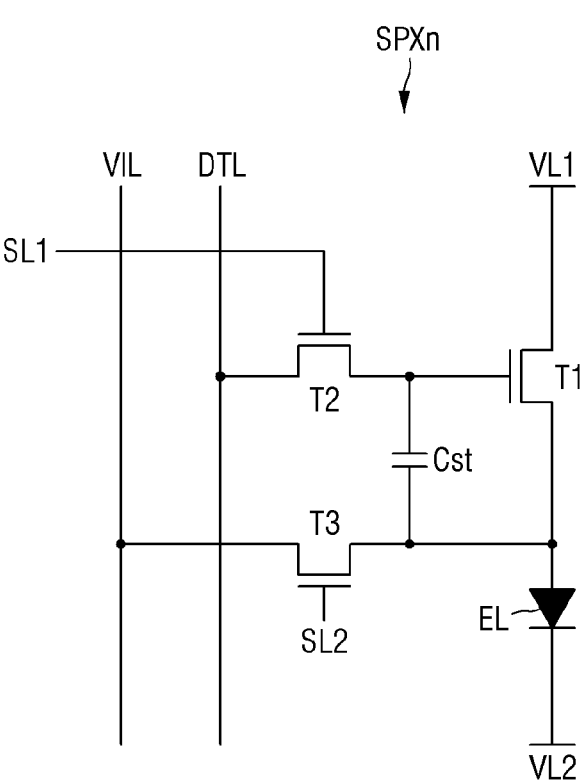
FIG. 4 is an equivalent circuit diagram of an embodiment of a sub-pixel according to the invention.

FIG. 4 is an equivalent circuit diagram of an embodiment of a sub-pixel according to the invention.

Referring to FIG. 4, each of the sub-pixels SPXn (n is a natural number) of the display device 10 in an embodiment includes three transistors T1, T2 and T3 and one storage capacitor Cst in addition to a light-emitting diode EL.

The light-emitting diode EL emits light in proportional to the current supplied through the first transistor T1. The light-emitting diode EL includes a first electrode, a second electrode, and at least one light-emitting element EMD (refer to FIG. 3) disposed therebetween. The light-emitting element EMD may emit light in a particular wavelength range by an electric signal transmitted from the first electrode and the second electrode. In the following description, the first electrode of the light-emitting element EMD is the pixel electrode PXE serving as an anode electrode, and the second electrode thereof is the common electrode CME serving as a cathode electrode. However, it should be understood that the invention is not limited thereto. On the contrary, the first electrode may be the common electrode CME serving as the cathode electrode, and the second electrode may be the pixel electrode PXE serving as the anode electrode.

A first end of the light-emitting diode EL may be connected to a source electrode of the first transistor T1, and a second end thereof may be connected to a second voltage line VL2 from which a low-level voltage (hereinafter also referred to as a second supply voltage) lower than a high-level voltage (hereinafter also referred to as a first supply voltage) of a first voltage line VL1 is applied. In addition, the second end of the light-emitting diode EL may be connected to a source electrode of the second transistor T2.

The first transistor T1 adjusts an electric current flowing from the first voltage line (also referred to as a first supply voltage line) VL1 from which the first supply voltage is supplied to the light-emitting diode EL according to the voltage difference between a gate electrode and the source electrode. In an embodiment, the first transistor T1 may be a driving transistor for driving the light-emitting diode EL, for example. The gate electrode of the first transistor T1 may be connected to a source electrode of the second transistor T2, the source electrode thereof may be connected to the first electrode of the light-emitting diode EL, and the drain electrode thereof may be connected to the first voltage line VL1 from which the first supply voltage is applied.

The second transistor T2 is turned on by a scan signal of the first scan line SL1 to connect the data line DTL with the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

A third transistor T3 may be turned on by a scan signal of a second scan line SL2 to connect an initialization voltage line VIL with the first end of the light-emitting diode EL. The gate electrode of the third transistor T3 may be connected to the second scan line SL2, the drain electrode thereof may be connected to the initialization voltage line VIL, and the source electrode thereof may be connected to the first end of the light-emitting diode EL or the source electrode of the first transistor T1. The second transistor T2 and the third transistor T3 may be simultaneously turned on by the same scan signal.

The source electrode and the drain electrode of each of the transistors T1, T2 and T3 are not limited to those described above. They may be connected in the opposite way. In addition, each of the transistors T1, T2 and T3 may be formed or provided as a thin-film transistor. In addition, although each of the transistors T1, T2 and T3 implemented as an n-type metal oxide semiconductor field effect transistor ("MOSFET") in the embodiment shown in FIG. 3, the invention is not limited thereto. That is to say, each of the transistors T1, T2 and T3 may be implemented as a p-type MOSFET, or some of the transistors T1, T2 and T3 may be implemented as n-type MOSFETs while the others may be implemented as p-type MOSFETs.

The storage capacitor Cst is formed or provided between the gate electrode and the source electrode of the first transistor T1. The storage capacitor Cst stores a voltage difference between the gate voltage and the source voltage of the first transistor T1.

Hereinafter, the structure of one pixel PX of the display device 10 in an embodiment will be described in detail with reference to other drawings.

Figure 5:
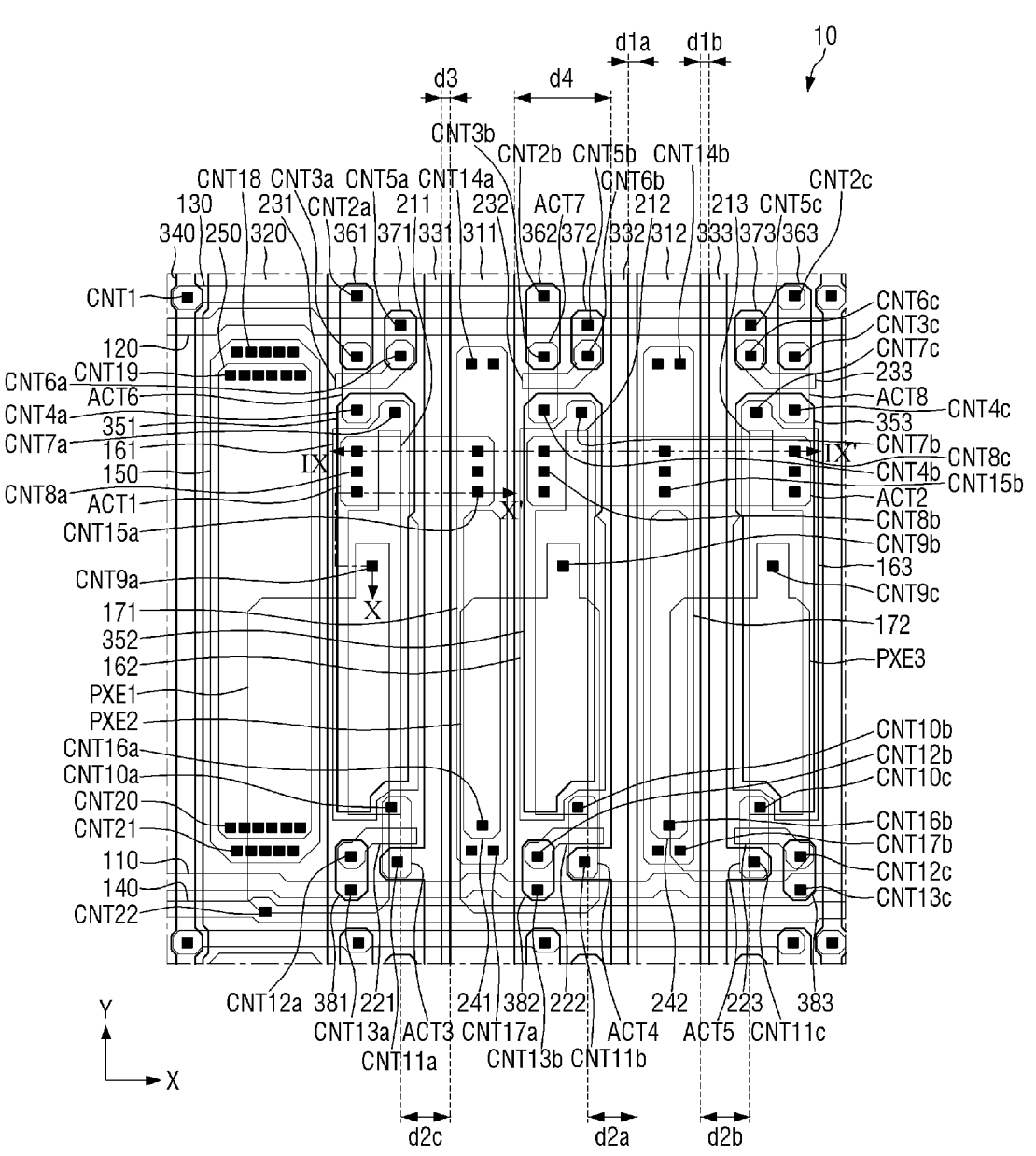
FIG. 5 is a view showing an embodiment of a layout of a plurality of lines disposed in a pixel of a display device according to the invention.
Figure 6:
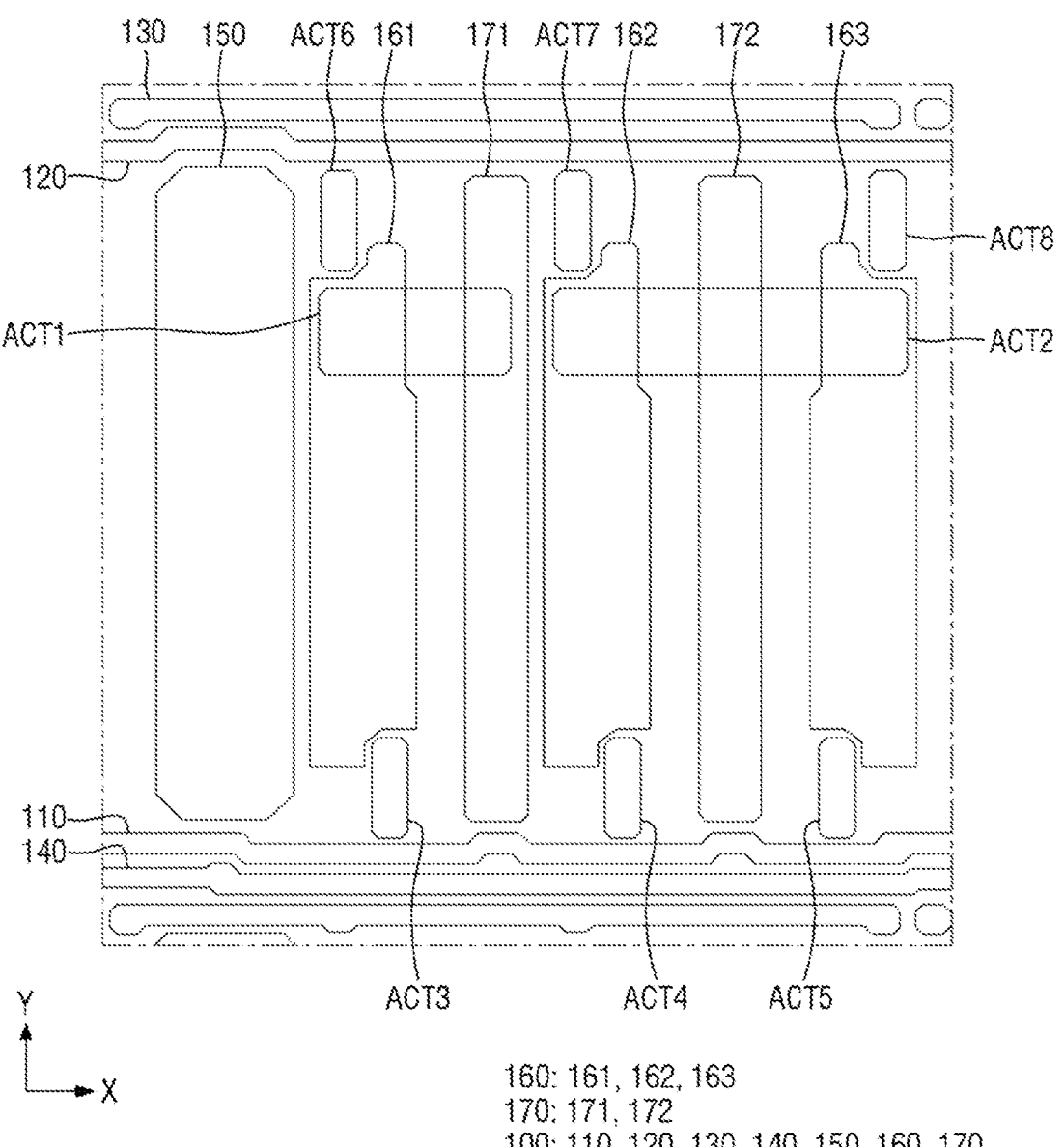
Figure 7:
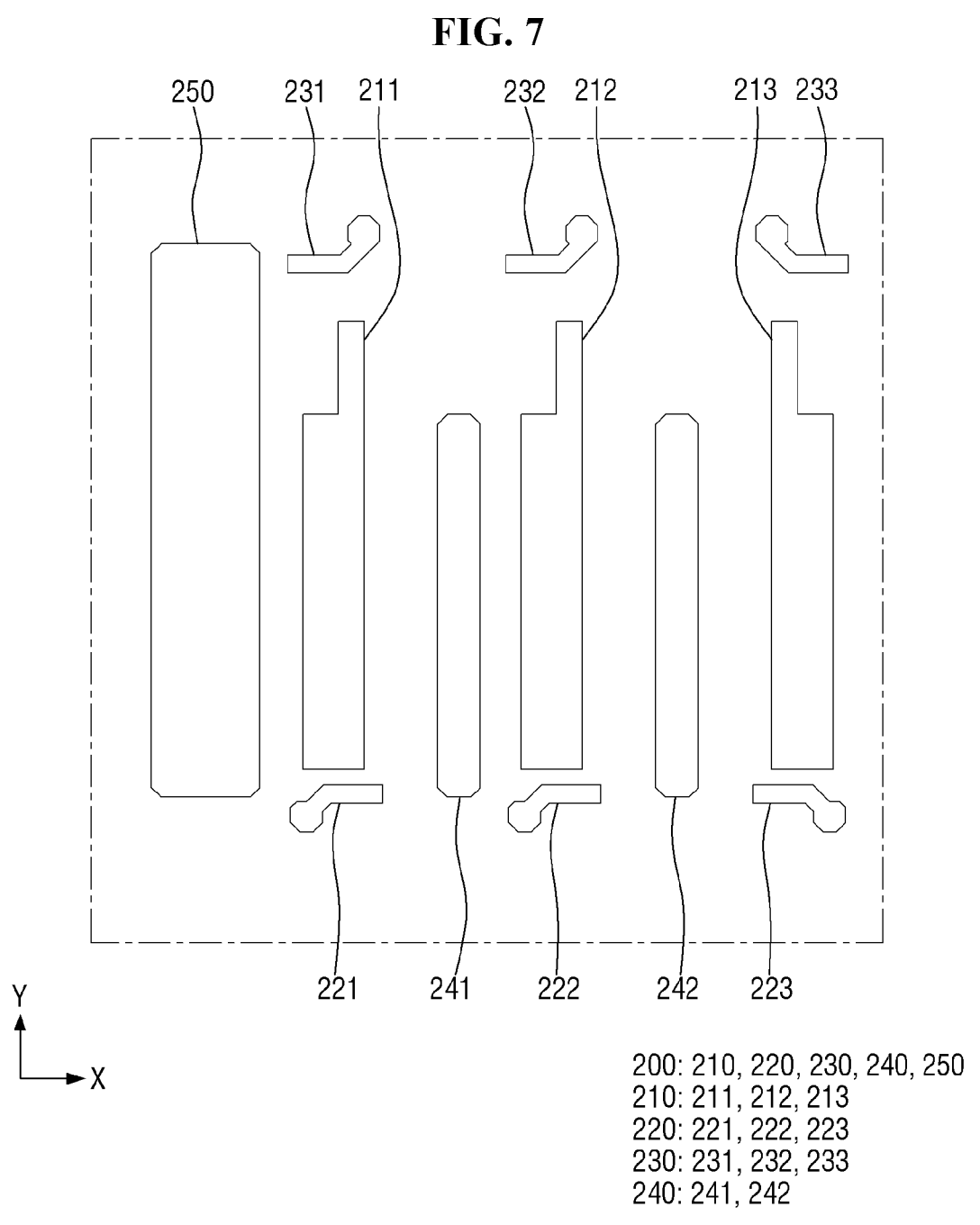
Figure 8:
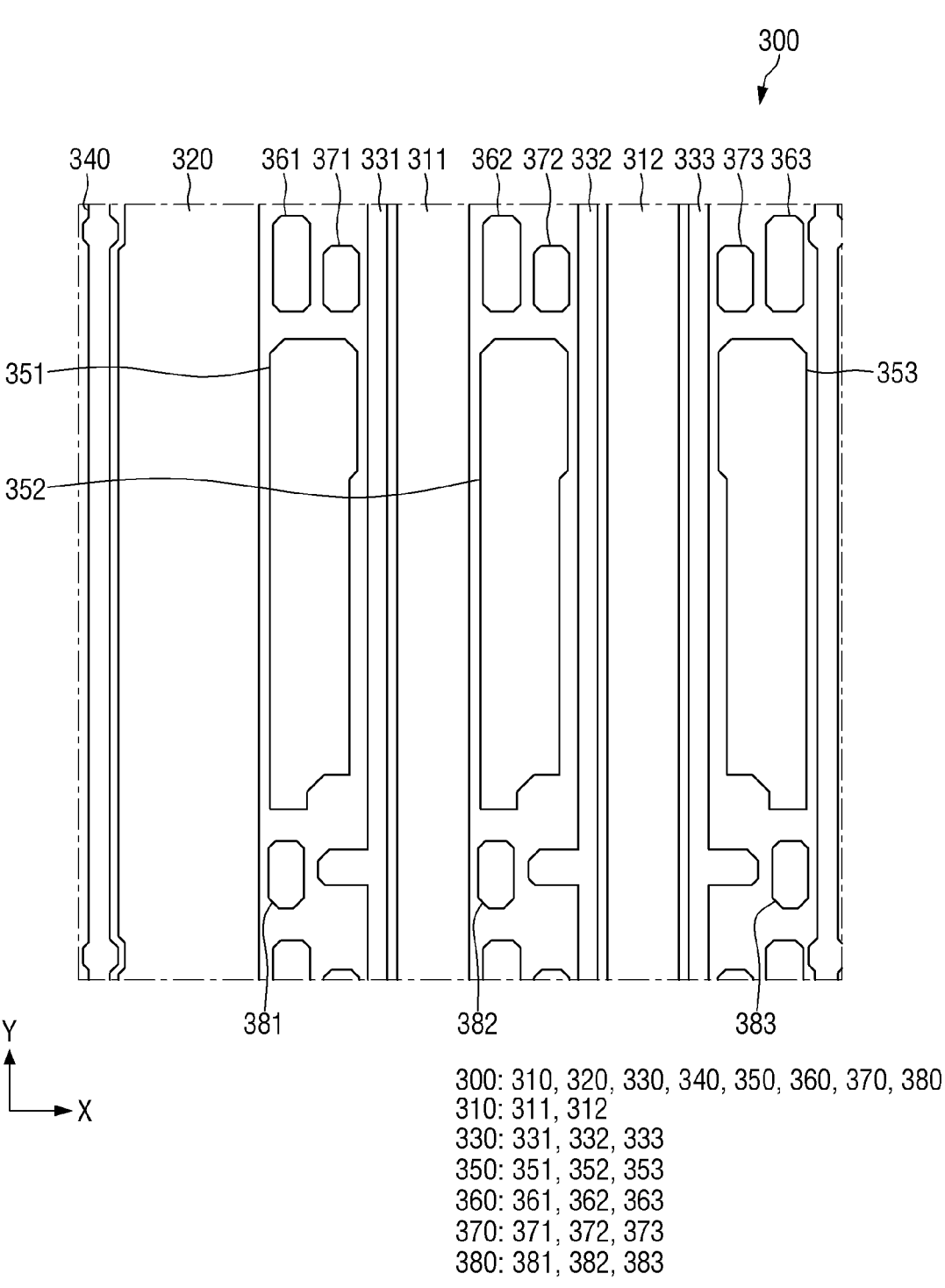
Figure 9:
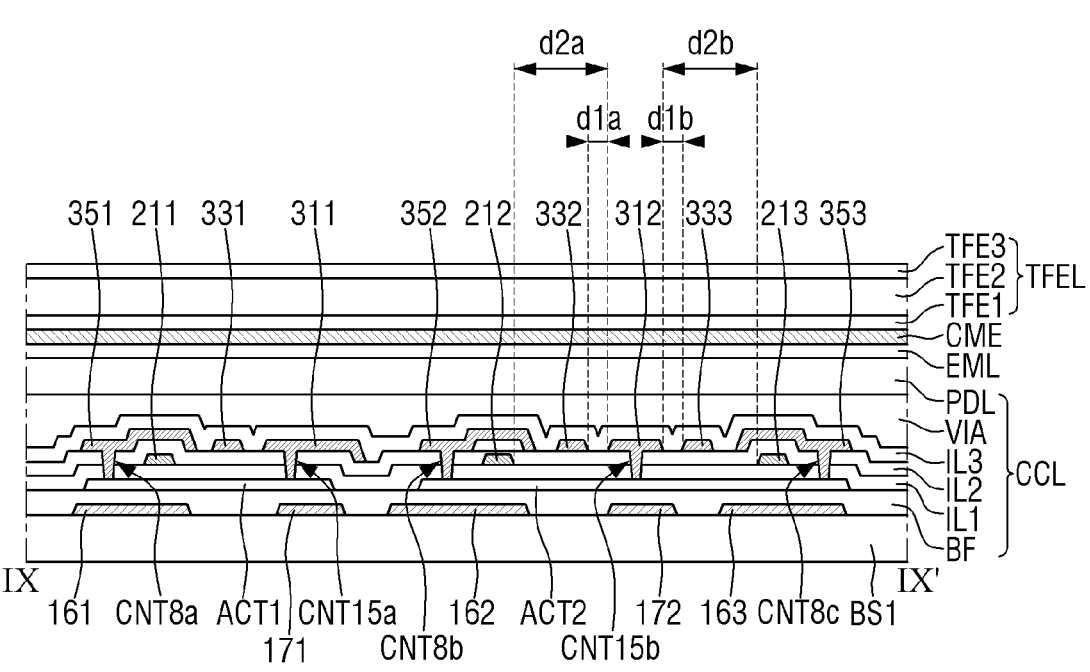
FIG. 9 is a cross-sectional view taken along line IX-IX' of FIG. 5.
Figure 10:
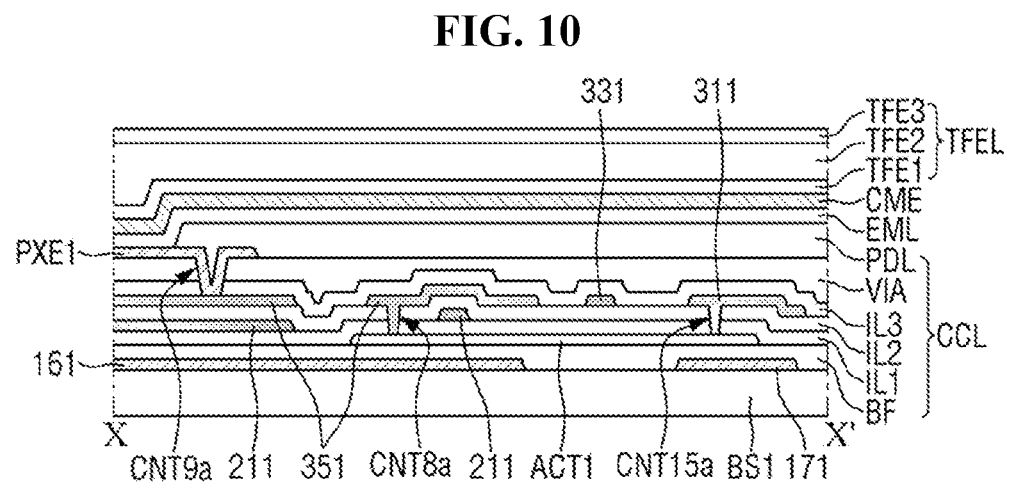

FIG. 5 is a view showing an embodiment of a layout of a plurality of lines disposed in a pixel of a display device according to the invention. FIGS. 6 to 8 are plan views showing some of the plurality of lines of FIG. 5, respectively. FIG. 9 is a cross-sectional view taken along line IX-IX' of FIG. 5. FIG. 10 is a cross-sectional view taken along line X-X' of FIG. 5.

FIG. 5 is a plan view showing a plurality of lines disposed in a pixel PX of the display device 10, i.e., lines of a first conductive layer 100, a second conductive layer 200 and a third conductive layer 300, and a semiconductor layer ACTL. FIG. 6 shows the first conductive layer 100 and the semiconductor layer ACTL together, FIG. 7 shows only the second conductive layer 200, and FIG. 8 shows the third conductive layer 300. FIG. 9 shows a cross section of the first transistor T1 connected to the first to third sub-pixels SPX1, SPX2 and SPX3 in a pixel PX, taken along the direction in which the first to third sub-pixels SPX1, SPX2 and SPX3 are arranged. FIG. 10 shows a cross section of the first transistor T1 and the first pixel electrode PEX1 connected to the first sub-pixel SPX1 in the pixel PX.

Hereinafter, the first display substrate SUB1 in the stack structure of the display device 10 described above with reference to FIG. 3 will be described with reference to FIGS. 5 to 10. The second display substrate SUB2 and the filling layer FL are substantially identical to those described above with reference to FIG. 3.

Referring to FIGS. 5 to 10, the display device 10 includes the first base substrate BS1 serving to support elements thereon, and includes a semiconductor layer ACTL disposed on the first base substrate BS1 (refer to FIG. 3), a plurality of conductive layers and a plurality of insulating layers. The plurality of conductive layers may include a first conductive layer 100, a second conductive layer 200, a third conductive layer 300 and a fourth conductive layer. The plurality of insulating layers may include a buffer layer BF, a first insulating layer IL1, a second insulating layer IL2, a third insulating layer IL3, and a via layer VIA.

In the following description, new reference numerals are given to the substantially same elements of FIG. 4 for convenience of illustration.

Initially, a pixel PX will be described. In the display device 10 in an embodiment, the shape of various patterns forming the second sub-pixel SPX2 may be substantially identical to the shape of various patterns forming the first sub-pixel SPX1 in the plan view.

The first base substrate BS1 may be an insulating substrate and may include a transparent material.

The first conductive layer 100 is disposed on the first base substrate BS1. The first conductive layer 100 may include a first scan line 110, a second scan line 120, a subsidiary initialization line 130, an auxiliary line 140, a first bottom metal pattern 150, light-blocking patterns 160, and second bottom metal patterns 170.

The first scan line 110 may transmit a scan signal to the gate electrode of the second transistor T2 of each of the sub-pixels SPX1, SPX2 and SPX3. The first scan line 110 is disposed on the lower side in each of the sub-pixels SPX1, SPX2 and SPX3 in the drawings, and is extended in the first direction X. The first scan line 110 may be extended to another pixel PX adjacent to the pixel PX in the first direction X.

The first scan line 110 may be electrically connected to a second gate conductive pattern 220 to apply a first scan signal. The first scan line 110 may partially overlap with a first connection electrode 380 to be described later. The first scan line 110 may be electrically connected to the first connection electrode 380 through thirteenth contact holes CNT13*a*, CNT13*b* and CNT13*c* penetrating the buffer layer BF, the first insulating layer IL1 and the second insulating layer IL2. The first connection electrode 380 may partially overlap the second gate conductive pattern 220. The first connection electrode 380 may be electrically connected to the second gate conductive pattern 220 through twelfth contact holes CNT12*a*, CNT12*b* and CNT12*c* penetrating the second insulating layer IL2.

The second scan line 120 may transmit a second scan signal to the third transistor T3 of each of the sub-pixels SPX1, SPX2 and SPX3. The second scan line 120 is disposed on the upper side in each of the sub-pixels SPX1, SPX2 and SPX3 in the drawings, and is extended in the first direction X. The second scan line 120 may be extended to another pixel PX adjacent to the pixel PX in the first direction X.

The second scan line 120 may be electrically connected to a third gate conductive pattern 230 to apply a second scan signal. The second scan line 120 may partially overlap with a second connection electrode 370 to be described later. The second scan line 120 may be electrically connected to the second connection electrode 370 through fifth contact holes CNT5*a*, CNT5*b* and CNT5*c* penetrating the buffer layer BF, the first insulating layer IL1 and the second insulating layer IL2. The second connection electrode 370 may partially overlap the third gate conductive pattern 230. The second connection electrode 370 may be electrically connected to the third gate conductive pattern 230 through sixth contact holes CNT6*a*, CNT6*b* and CNT6*c* penetrating the second insulating layer IL2.

The subsidiary initialization line 130 may transmit an initialization voltage applied from an initialization line 340 to be described later to the third transistor T3 of each of the sub-pixels SPX1, SPX2 and SPX3. The subsidiary initialization line 130 is disposed on the upper side of each of the pixel electrodes PXE1, PXE2 and PXE3 and is extended in the first direction X in the drawings. The subsidiary initialization line 130 may be disposed on the upper side of the second scan line 120. The subsidiary initialization line 130 may be extended to another pixel PX adjacent to the pixel PX in the first direction X.

The subsidiary initialization line 130 may be electrically connected to the first electrode of the third transistor T3 to apply an initialization voltage. The subsidiary initialization line 130 may partially overlap a third connection electrode 360 to be described later. The subsidiary initialization line 130 may be electrically connected to the third connection electrode 360 through second contact holes CNT2*a*, CNT2*b* and CNT2*c* penetrating the buffer layer BF, the first insulating layer IL1 and the second insulating layer IL2. The third connection electrode 360 may partially overlap the sixth semiconductor pattern ACT6. The third connection electrode 360 may be electrically connected to the first electrode of the third transistor T3 through third contact holes CNT3*a*, CNT3*b* and CNT3*c* penetrating the first insulating layer IL1 and the second insulating layer IL2.

The auxiliary line 140 is an external line for driving compensation and may be connected to an external driving circuit (not shown). The auxiliary line 140 is disposed on the lower side in each of the sub-pixels SPX1, SPX2 and SPX3 in the drawings, and is extended in the first direction X. The auxiliary line 140 is disposed on the lower side of the first scan line 110. The auxiliary line 140 may be connected to a second power line 320 through a twenty-second contact hole CNT22 penetrating the buffer layer BF, the first insulating layer IL1 and the second insulating layer IL2. The auxiliary line 140 may be extended to another pixel PX adjacent to the pixel PX in the first direction X.

The first bottom metal pattern 150 has a shape extended in the second direction Y, and may be disposed between the first scan line 110 and the second scan line 120. The first bottom metal pattern 150 may be electrically connected to the second power line 320 to be described later through an eighteenth contact hole CNT18 penetrating the buffer layer BF, the first insulating layer IL1, and the second insulating layer IL2. In this manner, the electrical resistance of the second power line 320 may be reduced, and signals and voltages applied to the second power line 320 may be transmitted more effectively. In addition, the first bottom metal pattern 150 may partially overlap a second top metal pattern (also referred to as a second overlapping conductive pattern) 250 to be described later.

The light-blocking patterns 160 may serve to protect the first semiconductor pattern ACT1 and the second semiconductor pattern ACT2 from external light. The light-blocking patterns 160 may have a patterned shape. The light-blocking patterns 160 may include a first light-blocking pattern 161 disposed in the first sub-pixel SPX1, a second light-blocking pattern 162 disposed in the second sub-pixel SPX2, and a third light-blocking pattern 163 disposed in the third sub-pixel SPX3. The first light-blocking pattern 161 may be disposed to cover at least a channel region of the first semiconductor pattern ACT1 thereon, and the second light-blocking pattern 162 and the third light-blocking pattern 163 may be disposed to cover at least a channel region of the second semiconductor pattern ACT2 thereon.

The light-blocking patterns 160 may be electrically connected to data conductive patterns 350 thereon through seventh contact holes CNT7*a*, CNT7*b* and CNT7*c* penetrating the buffer layer BF, the first insulating layer IL1 and the second insulating layer IL2. In this manner, the electrical resistance of the data conductive pattern 350 may be reduced, and signals and voltages applied to the data conductive pattern 350 may be transmitted more effectively.

The second bottom metal patterns 170 may have a shape extended in the second direction Y, and may be disposed between adjacent light-blocking patterns 160. The second bottom metal patterns 170 may include a first subsidiary bottom metal pattern 171 disposed between the first light-blocking pattern 161 and the second light-blocking pattern 162, and a second subsidiary bottom metal pattern 172 disposed between the second light-blocking pattern 162 and the third light-blocking pattern 163.

The second bottom metal patterns 170 may be electrically connected to a first power line 310 through fourteenth contact holes CNT14*a* and CNT14*b* and seventeenth contact holes CNT17*a* and CNT17*b* penetrating the buffer layer BF, the first insulating layer IL1 and the second insulating layer IL2. In this manner, the electrical resistance of the first power line 310 may be reduced, and signals and voltages applied to the first power line 310 may be transmitted more effectively.

The second bottom metal pattern 170 may partially overlap the first power line 310 and a first overlapping conductive pattern 240.

The buffer layer BF may be disposed over the first conductive layer 100. The buffer layer BF may be disposed to cover the entire surface of the first base substrate BS1 on which the first conductive layer 100 is disposed. The buffer layer BF may include silicon nitride, silicon oxide, silicon oxynitride, or the like. In an embodiment of the invention, the buffer layer BF may include a double layer of SiNx/SiOX.

The semiconductor layer ACTL may be disposed on the buffer layer BF. The semiconductor layer ACTL may include first to eighth semiconductor patterns ACT1, ACT2, ACT3, ACT4, ACT5, ACT6, ACT7 and ACT8.

The first and second semiconductor patterns ACT1 and ACT2 may be an active layer of the first transistor T1 included in one pixel PX, the third to fifth semiconductor patterns ACT3, ACT4 and ACT5 may be an active layer of the second transistor T2 included in the pixel PX, and the sixth to eighth semiconductor patterns ACT6, ACT7 and ACT8 may be an active layer of the third transistor T3 included in the pixel PX.

The first to eighth semiconductor patterns ACT1, ACT2, ACT3, ACT4, ACT5, ACT6, ACT7 and ACT8 extended in the first direction X or the second direction Y, and may have a quadrangular (e.g., rectangular) shape or an expanded shape that both ends have a wider width.

Each of the first to eighth semiconductor patterns ACT1, ACT2, ACT3, ACT4, ACT5, ACT6, ACT7 and ACT8 may include a channel region overlapping the gate electrode in the thickness direction and conductive regions disposed on one side and the opposite side of the channel region. The conductive regions may have higher conductivity and lower electrical resistance than the channel region. The conductive regions of each of the first to eighth semiconductor patterns ACT1, ACT2, ACT3, ACT4, ACT5, ACT6, ACTT and ACT8 may include the source electrode and the drain electrode (or the first source/drain electrode and the second source/drain electrode) of the respective transistors where they overlap the second conductive layer 200 or the third conductive layer 300.

The first and second semiconductor patterns ACT1 and ACT2 may be disposed near the center of the pixel PX with respect to the second direction Y. The first semiconductor pattern ACT1 may be disposed on the opposite side of the first direction X relative to the second semiconductor pattern ACT2, and the second semiconductor pattern ACT2 may be disposed on the side indicated by the first direction X relative to the first semiconductor pattern ACT1. Each of the first and second semiconductor patterns ACT1 and ACT2 may be an active layer of the first transistor T1 of each of the first to third sub-pixels SPX1, SPX2 and SPX3.

Specifically, the first semiconductor pattern ACT1 may be an active layer of the first transistor T1 of the first sub-pixel SPX1, and the second semiconductor pattern ACT2 may be an active layer of the first transistor T1 of each of the second and third sub-pixels SPX2 and SPX3. In other words, the second and third sub-pixels SPX2 and SPX3 may share the second semiconductor pattern ACT2 as the active layer of the first transistor T1.

The first semiconductor pattern ACT1 may partially overlap a first data line 331 and a first power line 311. The second semiconductor pattern ACT2 may partially overlap a second data line 332, a third data line 333 and a second power line 312.

The third to fifth semiconductor patterns ACT3, ACT4 and ACT5 may be disposed on the opposite side to the second direction Y in the pixel PX. The third to fifth semiconductor patterns ACT3, ACT4 and ACT5 may be disposed on the opposite side to the second direction Y relative to the first and second semiconductor patterns ACT1 and ACT2. The third semiconductor pattern ACT3 may be disposed on the opposite side to the first direction X relative to the fourth semiconductor pattern ACT4 and the fifth semiconductor pattern ACT5, the fourth semiconductor pattern ACT4 may be disposed between the third semiconductor pattern ACT3 and the fifth semiconductor pattern ACT5, and the fifth semiconductor pattern ACT5 may be disposed on the side indicated by the first direction X relative to the third semiconductor pattern ACT3 and the fourth semiconductor pattern ACT4. Each of the third to fifth semiconductor patterns ACT3, ACT4 and ACT5 may be an active layer of the second transistor T2 of each of the first to third sub-pixels SPX1, SPX2 and SPX3.

The sixth to eighth semiconductor patterns ACT6, ACT7 and ACT8 may be disposed on the side indicated by the second direction Y in the pixel PX. The sixth to eighth semiconductor patterns ACT6, ACT7 and ACT8 may be disposed on the side indicated by the second direction Y relative to the first and second semiconductor patterns ACT1 and ACT2. The sixth semiconductor pattern ACT6 may be disposed on the opposite side to the first direction X relative to the seventh semiconductor pattern ACT7 and the eighth semiconductor pattern ACT8, the seventh semiconductor pattern ACT7 may be disposed between the sixth semiconductor pattern ACT6 and the eighth semiconductor pattern ACT8, and the eighth semiconductor pattern ACT8 may be disposed on the side indicated by the first direction X relative to the sixth semiconductor pattern ACT6 and the seventh semiconductor pattern ACT7. Each of the sixth to eighth semiconductor patterns ACT6, ACT7 and ACT8 may be an active layer of the third transistor T3 of each of the first to third sub-pixels SPX1, SPX2 and SPX3.

The semiconductor layer ACTL may include an oxide semiconductor. In an embodiment, the oxide semiconductor may include indium-tin oxide ("ITO"), indium-gallium-tin oxide ("ITGO"), indium-gallium-zinc oxide ("IGZO") or indium-gallium-zinc-tin oxide ("IGZTO"). However, it should be understood that the invention is not limited thereto. In an embodiment, the semiconductor layer ACTL may include polycrystalline silicon, monocrystalline silicon, amorphous silicon, etc.

The first insulating layer IL1 is disposed on the semiconductor layer ACTL. The first insulating layer IL1 may be a gate insulator. In an embodiment, the first insulating layer IL1 may include a silicon compound, a metal oxide, etc. In an embodiment, the first insulating layer IL1 may include silicon oxide, silicon nitride, silicon oxynitride, aluminum oxide, tantalum oxide, hafnium oxide, zirconium oxide, titanium oxide, etc., for example.

The second conductive layer 200 is disposed on the first insulating layer IL1.

The second conductive layer 200 may include first to third gate conductive patterns 210, 220 and 230 and first and second overlapping conductive patterns 240 and 250.

Each of the first to third gate conductive patterns 210, 220 and 230 may partially overlap the first to eighth semiconductor patterns ACT1, ACT2, ACT3, ACT4, ACT5, ACT6, ACTT, and ACT5. The first to third gate conductive patterns 210, 220 and 230 may include the gate electrodes of the transistors of each of the first to third sub-pixels SPX1, SPX2 and SPX3 where they overlap them.

The first gate conductive pattern 210 may include a first gate electrode 211 of the first transistor T1 of the first sub-pixel SPX1 overlapping a part of the first semiconductor pattern ACT1, a second gate electrode 212 of the first transistor T1 of the second sub-pixel SPX2 overlapping a part of the second semiconductor pattern ACT2, and a third gate electrode 213 of the first transistor T1 of the third sub-pixel SPX3 overlapping a part of the third semiconductor pattern ACT3.

The first gate electrode 211 may overlap at least the channel region of the first semiconductor pattern ACT1. Similarly, the second gate electrode 212 and the third gate electrode 213 may overlap the channel region of the second semiconductor pattern ACT2.

The first gate electrode 211 may be disposed on the side opposite to the first power line 311 with the first data line 331 therebetween in the plan view. The second gate electrode 212 may be disposed on the side opposite to the second power line 312 with the second data line 332 therebetween in the plan view. The third gate electrode 213 may be disposed on the side opposite to the second power line 312 with the third data line 333 therebetween in the plan view.

The first to third gate electrodes 211, 212 and 213 may overlap the first to third data conductive patterns 351, 352 and 353, respectively, to constitute storage capacitors Cst. The first to third gate electrodes 211, 212 and 213 may include the first electrodes of the storage capacitors Cst of the first to third sub-pixels SPX1, SPX2 and SPX3, respectively, where they overlap the conductive patterns. As will be described later, the first to third data conductive patterns 351, 352 and 353 may include the second electrodes of the storage capacitors Cst, respectively.

The first gate conductive pattern 210 may be electrically connected to the third to fifth semiconductor patterns ACT3, ACT4 and ACT5 through tenth contact holes CNT10a, CNT10b and CNT10c penetrating the first insulating layer IL1.

The second gate conductive pattern 220 may include a fourth gate electrode 221 of the second transistor T2 of the first sub-pixel SPX1 overlapping a part of the third semiconductor pattern ACT3, a fifth gate electrode 222 of the second transistor T2 of the second sub-pixel SPX2 overlapping a part of the fourth semiconductor pattern ACT4, and a sixth gate electrode 223 of the second transistor T2 of the third sub-pixel SPX3 overlapping a part of the fifth semiconductor pattern ACT5.

The fourth gate electrode 221 may overlap at least the channel region of the third semiconductor pattern ACT3. Similarly, the fifth gate electrode 222 and the sixth gate electrode 223 may overlap the channel regions of the fourth semiconductor pattern ACT4 and the fifth semiconductor pattern ACT5, respectively.

The second gate conductive pattern 220 may be electrically connected to the first scan line 110 through the first connection electrode 380. The second gate conductive pattern 220 may be connected to the first connection electrode 380 through the twelfth contact holes CNT12a, CNT12b and CNT12c penetrating the second insulating layer IL2, and the first connection electrode 380 may be connected to the first scan line 110 through the thirteenth contact holes CNT13a, CNT13b and CNT13c penetrating the buffer layer BF, the first insulating layer IL1 and the second insulating layer IL2.

The third gate conductive pattern 230 may include a seventh gate electrode 231 of the third transistor T3 of the first sub-pixel SPX1 overlapping a part of the sixth semiconductor pattern ACT6, an eighth gate electrode 232 of the third transistor T3 of the second sub-pixel SPX2 overlapping a part of the seventh semiconductor pattern ACT7, and a ninth gate electrode 233 of the third transistor T3 of the third sub-pixel SPX3 overlapping a part of the eighth semiconductor pattern ACT8.

The seventh gate electrode 231 may overlap at least the channel region of the sixth semiconductor pattern ACT6. Similarly, the eighth gate electrode 232 and the ninth gate electrode 233 may overlap the channel regions of the seventh semiconductor pattern ACT7 and the eighth semiconductor pattern ACT8, respectively.

The third gate conductive pattern 230 may be electrically connected to the second scan line 120 through the second connection electrode 370. The third gate conductive pattern 230 may be connected to the second connection electrode 370 through the sixth contact holes CNT6a, CNT6b and CNT6c penetrating the second insulating layer IL2, and the second connection electrode 370 may be connected to the second scan line 120 through the fifth contact holes CNT5a, CNT5b and CNT5c penetrating the buffer layer BF, the first insulating layer IL1 and the second insulating layer IL2.

The first and second overlapping conductive patterns 240 and 250 may overlap at least one of the first power line 310 and the second power line 320, and may be electrically connected to it through sixteenth contact holes CNT16a and CNT16b, a nineteenth contact hole CNT19 and a twentieth contact hole CNT20. Accordingly, the electrical resistance of each of the lines may be reduced, and signals and voltages may be transmitted more effectively.

The first overlapping conductive pattern 240 may include a first subsidiary overlapping conductive pattern 241 disposed between the first gate electrode 211 and the second gate electrode 212, and a second subsidiary overlapping conductive pattern 242 disposed between the second gate electrode 212 and the third gate electrode 213.

In an embodiment, the first overlapping conductive pattern 240 may overlap the first power line 310 and may be electrically connected to it through the sixteenth contact holes CNT16a and CNT16b penetrating the second insulating layer IL2, for example. The second overlapping conductive pattern 250 may overlap the second power line 320 and may be electrically connected to it through the nineteenth contact hole CNT19, the twentieth CNT20, etc., penetrating the second insulating layer IL2.

In an embodiment, the second conductive layer 200 may include at least one metal including molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) or copper (Cu). The second conductive layer 200 may consist of a single layer or multiple layers.

The second insulating layer IL2 is disposed on the second conductive layer 200. The second insulating layer IL2 may be an interlayer dielectric layer that insulates the second conductive layer 200 from the third conductive layer 300, which will be described later. In an embodiment, the second insulating layer IL2 may include an inorganic insulating material such as silicon oxide, silicon nitride, silicon oxynitride, hafnium oxide, aluminum oxide, titanium oxide, tantalum oxide or zinc oxide.

The third conductive layer 300 is disposed on the second insulating layer IL2. The third conductive layer 300 may include the first power line 310, the second power line 320, the data lines 330, the initialization line 340, the data conductive patterns 350, the first connection electrode 380, the second connection electrode 370 and the third connection electrode 360.

The first power line 310 may transmit the first supply voltage to each of the sub-pixels SPX1, SPX2 and SPX3. The first power line 310 may be extended in the second direction Y. The first power line 310 may include the first power line 311 disposed on the other side of the second gate electrode 212 in the first direction X in the plan view, and the second power line 312 disposed on one side of the second gate electrode 212 in the first direction X in the plan view.

The first power line 311 may be disposed between the first data line 331 and the second data line 332 in the plan view, and the second power line 312 may be disposed between the second data line 332 and the third data lines 333 in the plan view. The same first supply voltage may be applied to the first power line 311 and the second power line 312.

The first power line 310 may be extended to another pixel PX adjacent to the pixel PX in the second direction Y. The first power line 310 may overlap, but is not limited to, the first and second semiconductor patterns ACT1 and ACT2.

The first power line 310 may be electrically connected to each of the first and second semiconductor patterns ACT1 and ACT2 through the second bottom metal pattern 170. Specifically, the first power line 310 may be electrically connected to the second bottom metal pattern 170 through the fourteenth contact holes CNT14*a*, CNT14*b* and CNT14*c* penetrating the buffer layer BF, the first insulating layer IL1 and the second insulating layer IL2. The second bottom metal pattern 170 may be electrically connected to the first and second semiconductor patterns ACT1 and ACT2 through fifteenth contact holes CNT15*a* and CNT15*b*. Accordingly, the first supply voltage may be transferred to the first transistor T1 of each of the sub-pixels SPX1, SPX2 and SPX3.

The second power line 320 may transmit the second supply voltage to the common electrode CME. The second power line 320 may be extended in the second direction Y. The second supply voltage lower than the first supply voltage applied to the first power line 311 and the second power line 312 may be applied to the second power line 320.

The second power line 320 may be disposed on the opposite side to the first direction X relative to the first data conductive pattern 351. The second power line 320 may be disposed on the opposite side to the first power line 311 with the first data line 331 therebetween. The second supply voltage lower than the first supply voltage applied to the first power line 311 and the second power line 312 may be applied to the second power line 320.

The second power line 320 may be extended to another pixel PX adjacent to the pixel PX in the second direction Y. As described above, the second power line 320 may be connected to the first bottom metal pattern 150 through the eighteenth contact hole CNT18 and a twenty-first contact hole CNT21 penetrating the buffer layer BF, the first insulating layer IL1 and the second insulating layer IL2, and may be connected to the second top metal pattern 250 through the nineteenth contact hole CNT19 and the twentieth contact hole CNT20 penetrating the second insulating layer IL2. In this manner, the electrical resistance of the second power line 320 may be reduced, and signals and voltages applied to the second power line 320 may be transmitted more effectively.

The second power line 320 may partially overlap the first scan line 110, the second scan line 120, the subsidiary initialization line 130 and the auxiliary line 140.

The data lines 330 may include a first data line 331 disposed between the first gate electrode 211 and the first power line 311 in the plan view, a second data line 332 disposed between the second gate electrode 212 and the second power line in the plan view, and a third data line 333 disposed between the second power line 312 and the third gate electrode 213.

The first to third data lines 331, 332 and 333 may transmit data signals to each of the sub-pixels SPX1, SPX2 and SPX3. The first to third data lines 331, 332 and 333 may be extended in the second direction Y and may be sequentially arranged next to each other in the first direction X. Specifically, the first data line 331 and the second data line 332 may be arranged adjacent to each other in the first direction X, and the second data line 332 and the third data line 333 may be arranged adjacent to each other in the first direction X. The second data line 332 may be disposed between the first data line 331 and the third data line 333. The first to third data lines 331, 332 and 333 may be extended to another pixel PX adjacent to the pixel PX in the second direction Y.

The data lines 330 may be electrically connected to the third to fifth semiconductor patterns ACT3, ACT4 and ACT5 through eleventh contact holes CNT11*a*, CNT11*b* and CNT11*c* penetrating the first insulating layer IL1, and the second insulating layer IL2. Specifically, the first data line 331 may be electrically connected to the third semiconductor pattern ACT3, and thus may transmit a data signal to the second transistor T2 of the first sub-pixel SPX1. The second data line 332 may be electrically connected to the fourth semiconductor pattern ACT4, and thus may transmit a data signal to the second transistor T2 of the second sub-pixel SPX2. The third data line 333 may be electrically connected to the fifth semiconductor pattern ACT5. Accordingly, the data signal may be transmitted to the third transistor T3 of the third sub-pixel SPX3.

Two of the first data line 331, the second data line 332 and the third data line 333 which are adjacent to each other may partially overlap with one of the first and second semiconductor patterns ACT1 and ACT2. In an embodiment, the second data line 332 and the third data line 333 may partially overlap the second semiconductor pattern ACT2, for example. Specifically, a region of the second semiconductor pattern ACT2 on the opposite side to the first direction X may partially overlap the second data line 332, and a region of the second semiconductor pattern ACT2 on the side indicated by the first direction X may partially overlap the third data line 333.

The distance d1*a* from the second power line 312 to the second data line 332 may be substantially equal to the distance d1*b* from the second power line 312 to the third data line 333. The distance d1*a* from the second power line 312 to the second data line 332 may refer to the average separation distance from the edge of the second power line 312 on the opposite side to the first direction X to the edge of the second data line 332 on the side indicated by the first direction X. In addition, the distance d1*b* from the second power line 312 to the third data line 333 may refer to the average separation distance from the edge of the second power line 312 on the side indicated by the first direction X to the edge of the third data line 333 on the opposite side to the first direction X.

In addition, the distance d3 from the first power line 311 to the first data line 331 may be substantially equal to the distance d1*a* from the second power line 312 to the second data line 332 and the distance d1*b* from the second power line 312 to the third data line 333. The distance d4 from the first power line 311 to the second data line 332 may be greater than the distance d13 from the first power line 311 to the first data line 331.

The distance d3 from the first power line 311 to the first data line 331 may refer to the average separation distance from the edge of the first power line 311 on the opposite side to the first direction X to the edge of the first data line 331 on the side indicated by the first direction X. The distance d4a from the first power line 311 to the second data line 332 may refer to the average separation distance from the edge of the first power line 311 on the side indicated by the first direction X to the edge of the second data line 332 on the opposite side to the first direction X.

The distance d2a from the second power line 312 to the second gate electrode 212 may be substantially equal to the distance d2b from the second power line 312 to the third gate electrode 213. In addition, the distance d2a from the second power line 312 to the second gate electrode 212 and the distance d2b from the second power line 312 to the third gate electrode 213 may be substantially equal to the distance d2c from the first power line 311 to the first gate electrode 211.

The distance d2a from the second power line 312 to the second gate electrode 212 may refer to the average separation distance from the edge of the second power line 312 on the opposite side to the first direction X to the edge of the second data line 332 on the side indicated by the first direction X in the plan view. In addition, the distance d2b from the second power line 312 to the third gate electrode 213 may refer to the average separation distance from the edge of the second power line 312 on the side indicated by the first direction X to the edge of the third gate electrode 213 on the opposite side to the first direction X in the plan view. The distance d2c from the first power line 311 to the first gate electrode 211 may refer to the average separation distance from the edge of the first power line 311 on the opposite side to the first direction X to the edge of the first gate electrode 211 on the side indicated by the first direction X in the plan view.

The initialization line 340 may transmit a reference voltage to each of the sub-pixels SPX1, SPX2 and SPX3. The initialization line 340 may be disposed on the opposite side of the second power line 320 in the first direction X, and may be extended in the second direction Y. The initialization line 340 may be extended to another pixel PX adjacent to the pixel PX in the second direction Y.

The initialization line 340 may be electrically connected to the subsidiary initialization line 130 through a first contact hole CNT1 penetrating the buffer layer BF, the first insulating layer IL1 and the second insulating layer IL2. Accordingly, the reference voltage may be transferred to the third transistor T3 of each of the sub-pixels SPX1, SPX2 and SPX3. As described above, the subsidiary initialization line 130 may apply the initialization voltage to the first electrode of the third transistor T3.

The data conductive patterns 350 may constitute storage capacitors Cst together with the first gate conductive pattern 210. The data conductive patterns 350 may include a first data conductive pattern 351 disposed between the second power line 320 and the first data line 331, a second data conductive pattern 352 disposed between the first power line 311 and the second data line 332, and a third data conductive pattern 353 disposed on one side of the third data line 333 in the first direction X. The third data conductive pattern 353 may be disposed between the third data line 333 of one pixel PX and the initialization line 340 of another pixel PX disposed on one side of the pixel PX in the first direction X.

The data conductive patterns 350 may partially overlap the light-blocking pattern 160 thereunder. The data conductive patterns 350 may be connected to the light-blocking pattern 160 through the seventh contact holes CNT7a, CNT7b and CNT7c penetrating the buffer layer BF, the first insulating layer IL1 and the second insulating layer IL2. In addition, the data conductive patterns 350 may be connected to the sixth to eighth semiconductor patterns ACT6, ACTT and ACT8 through the fourth contact holes CNT4a, CNT4b and CNT4c penetrating the first insulating layer IL1 and the second insulating layer IL2. The data conductive patterns 350 may include the second source/drain electrode of the third transistor T3 of each of the sub-pixels SPX1, SPX2 and SPX3.

The data conductive patterns 350 may partially overlap the first and second semiconductor patterns ACT1 and ACT2. The data conductive patterns 350 may be connected to the first and second semiconductor patterns ACT1 and ACT2 through the eighth contact holes CNT8a, CNT8b and CNT8c penetrating the first insulating layer IL1 and the second insulating layer IL2. The data conductive patterns 350 may include the second source/drain electrode of the first transistor T1 of each of the sub-pixels SPX1, SPX2 and SPX3.

The data conductive pattern 350 may partially overlap the pixel electrodes PXE1, PXE2 and PXE3. The data conductive patterns 350 may be connected to the pixel electrodes PXE1, PXE2 and PXE3 through the ninth contact holes CNT9a, CNT9b and CNT9c penetrating the third insulating layer IL3 and the via layer VIA.

One end of the first connection electrode 380 may partially overlap the first scan line 110, and the other end thereof may partially overlap the second gate conductive pattern 220. The first connection electrode 380 may include a first subsidiary connection electrode 381 partially overlapping the fourth gate electrode 221, a second subsidiary connection electrode 382 partially overlapping the fifth gate electrode 222, and a third subsidiary connection electrode 383 partially overlapping the sixth gate electrode 223.

The first connection electrode 380 may be connected to the second gate conductive pattern 220 through twelfth contact holes CNT12a, CNT12b and CNT12c penetrating the second insulating layer IL2. In addition, the first connection electrode 380 may be connected to the first scan line 110 through the thirteenth contact holes CNT13a, CNT13b and CNT13c penetrating the buffer layer BF, the first insulating layer IL1 and the second insulating layer IL2.

One end of the second connection electrode 370 may partially overlap the second scan line 120, and the other end thereof may partially overlap the third gate conductive pattern 230. The second connection electrode 370 may include a fourth subsidiary connection electrode 371 partially overlapping the seventh gate electrode 231, a fifth subsidiary connection electrode 372 partially overlapping the eighth gate electrode 232, and a sixth subsidiary connection electrode 373 partially overlapping the ninth gate electrode 233.

The second connection electrode 370 may be connected to the third gate conductive pattern 230 through sixth contact holes CNT6a, CNT6b and CNT6c penetrating the second insulating layer IL2. In addition, the second connection electrode 370 may be connected to the second scan line 120 through the fifth contact holes CNT5a, CNT5b and CNT5c penetrating the buffer layer BF, the first insulating layer IL1 and the second insulating layer IL2.

One end of the third connection electrode 360 may partially overlap the subsidiary initialization line 130, and the other end thereof may partially overlap the sixth to eighth semiconductor patterns ACT6, ACT7 and ACT8. In addition, the third connection electrode 360 may partially overlap the second scan line 120. The third connection electrode 360 may include a seventh subsidiary connection electrode 361 partially overlapping the sixth semiconductor pattern ACT6, an eighth subsidiary connection electrode 362 partially overlapping the seventh semiconductor pattern ACT7, and a ninth subsidiary connection electrode 363 partially overlapping the eighth semiconductor pattern ACT8.

The third connection electrode 360 may be connected to the sixth to eighth semiconductor patterns ACT6, ACT7 and ACT8 through the third contact holes CNT3a, CNT3b and CNT3c penetrating the first insulating layer IL1 and the second insulating layer IL2. In addition, the third connection electrode 360 may be connected to the subsidiary initialization line 130 through the second contact holes CNT2a, CNT2b and CNT2c penetrating the buffer layer BF, the first insulating layer IL1 and the second insulating layer IL2.

The third connection electrode 360 may include the first source/drain electrode of the third transistor T3 of each of the sub-pixels SPX1, SPX2 and SPX3.

The third conductive layer 300 may include at least one metal including molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) or copper (Cu). The third conductive layer 300 may consist of a single layer or multiple layers. In an embodiment, the third conductive layer 300 may have a stack structure of Ti/Al/Ti, Mo/Al/Mo, Mo/AlGe/Mo, Ti/Cu, etc., for example.

The third insulating layer IL3 may be disposed on the third conductive layer 300. The third insulating layer IL3 may be a passivation film that covers and protects the third conductive layer 300. The third insulating layer IL3 may include an inorganic insulating material such as silicon oxide, silicon nitride, silicon oxynitride, hafnium oxide, aluminum oxide, titanium oxide, tantalum oxide and zinc oxide.

The via layer VIA is disposed over the third insulating layer IL3. The via layer VIA may completely cover the upper surface of the third insulating layer IL3 on which the fourth conductive layer (e.g., common electrode CME) is disposed. When the via layer VIA is formed or provided as an organic film, it may have a flat upper surface despite the level differences thereunder. In an embodiment, the via layer VIA may include an inorganic insulating material or an organic insulating material such as polyacrylate resin, epoxy resin, phenolic resin, polyamide resin, polyimide resin, unsaturated polyesters resin, poly phenylen ether resin, poly phenylene sulfide resin, and benzocyclobutene ("BCB").

The pixel electrodes PXE may be disposed on the via layer VIA. The pixel electrodes PXE may include a first pixel electrode PXE1, a second pixel electrode PXE2 and a third pixel electrode PXE3. The first pixel electrode PXE1 may include an anode electrode of the light-emitting element EMD of the first sub-pixel SPX1, the second pixel electrode PXE2 may include an anode electrode of the light-emitting element EMD of the second sub-pixel SPX2, and the third pixel electrode PXE3 may include an anode electrode of the light-emitting element EMD of the third sub-pixel SPX3.

A supply voltage may be applied to the first pixel electrode PXE1 from the first power line 311. A supply voltage may be applied from the second power line 312 to the second and third pixel electrodes PXE2 and PXE3.

The pixel-defining layer PDL may be disposed on the pixel electrodes PXE. A plurality of openings may be defined in the pixel-defining layer PDL. Each of the plurality of openings may expose a corresponding part of one of the first to third pixel electrodes PXE1, PXE2 and PXE3.

The emission material layer EML is disposed on the first to third pixel electrodes PXE1, PXE2 and PXE3 exposed by the pixel-defining layer PDL and the pixel-defining layer PDL. The emission material layer EML may include an organic layer including an organic material. The organic layer includes an organic, emissive layer and may further include hole injection/transport layers and/or electron injection/transport layers as auxiliary layers in some implementations to facilitate emission.

The common electrode CME (or a cathode electrode) may be disposed on the emission material layer EML. The common electrode CME may be connected across different pixels PX and different sub-pixels SPX1, SPX2 and SPX3. The common electrode CME may be entirely disposed across different pixels PX and the sub-pixels SPX1, SPX2 and SPX3. The common electrode CME may be a second electrode, e.g., a cathode electrode of a light-emitting element EMD (refer to FIG. 4).

The pixel electrodes PXE1, PXE2 and PXE3, the emission material layer EML and the common electrode CME may form a light-emitting element (e.g., an organic light-emitting element). Light emitted from the emission material layer EML may pass through the common electrode CME to exit upwardly.

When one pixel PX includes the sub-pixels SPX1, SPX2 and SPX3 arranged in a stripe pattern, the area of the openings defined in the pixel-defining layer PDL may be increased due to the first power line 310 including the first power line 311 and the second power line 312.

A thin-film encapsulation structure TFEL may be further disposed on the common electrode CME. The thin-film encapsulation structure TFEL may include at least one encapsulation layer. In an embodiment, the thin-film encapsulation structure TFEL may include a first inorganic film TFE1, an organic film TFE2 and a second inorganic film TFE3 stacked on the common electrode CME in this order, for example.

In the display device 10 in the embodiment of the invention, the first power line 310 in one pixel PX includes the first power line 311 supplying the first supply voltage to the first sub-pixel SPX1 and the second power line 312 supplying the first supply voltage to the second sub-pixel SPX2 and the third sub-pixel SPX3, so that the area of the openings exposing the pixel electrodes PXE1, PXE2 and PXE3 may be increased in the display device 10 including the sub-pixels SPX1, SPX2 and SPX3 arranged in a stripe pattern. In this manner, it is possible to improve the luminous efficiency of the display device 10.

Hereinafter, a display device 10 in another embodiment of the invention will be described.

A display device in another embodiment will be described focusing on differences and the redundant descriptions will be omitted.

Figure 11:
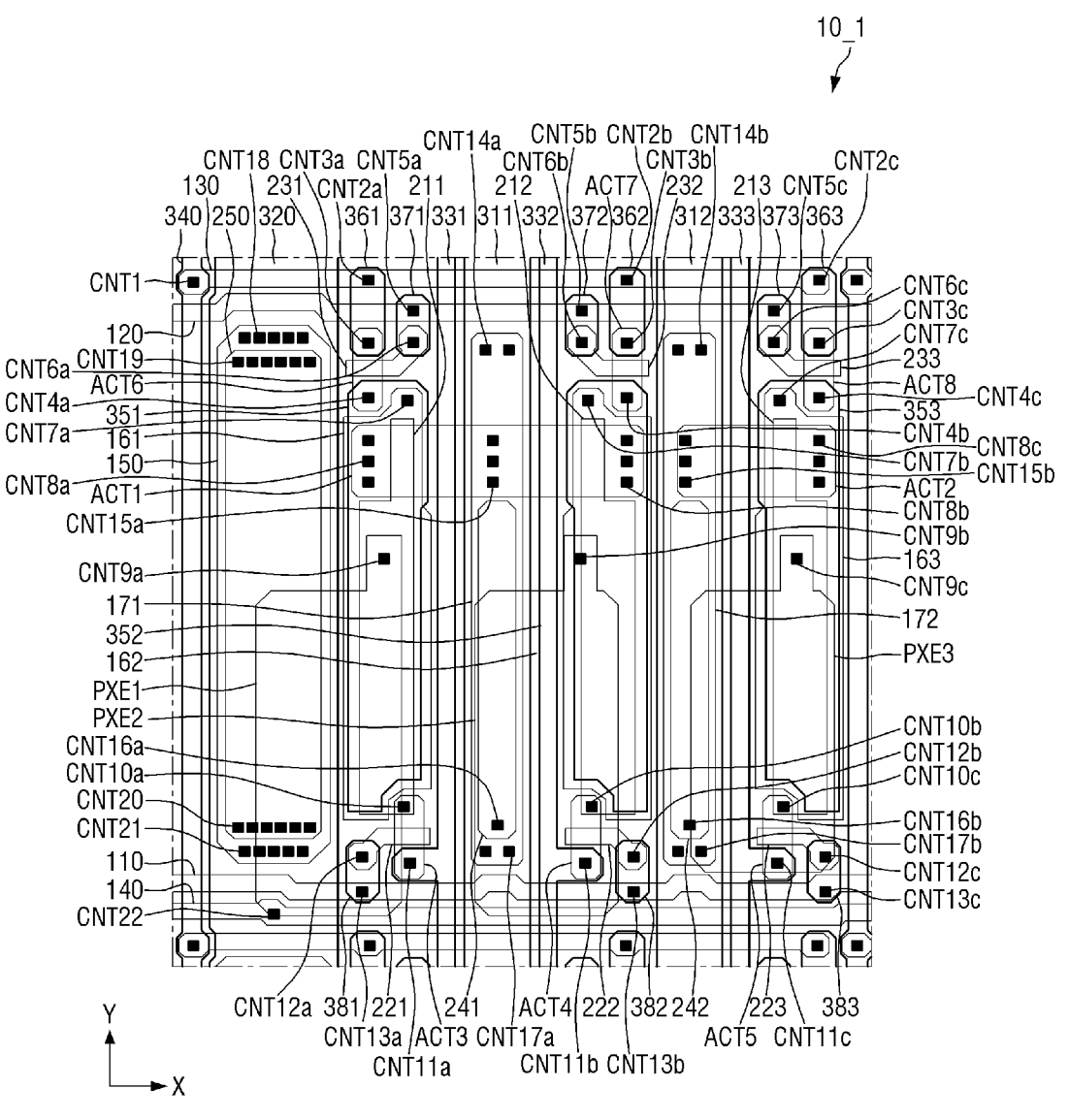
FIG. 11 is a view showing an embodiment of a layout of a plurality of lines disposed in a pixel of a display device according to the invention.
Figure 12:
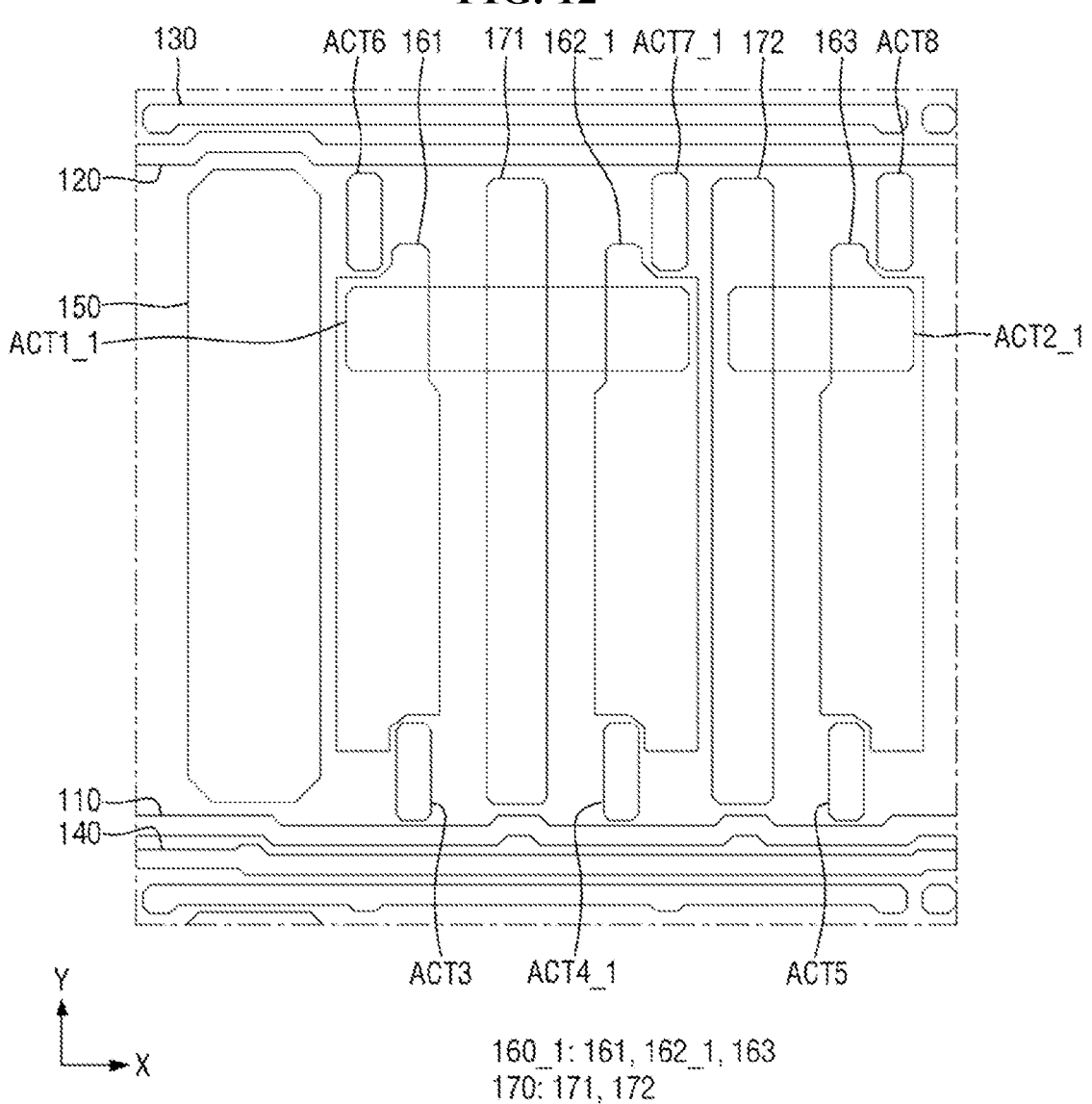
FIGS. 12 to 14 are plan views showing some of the plurality of lines of FIG. 11, respectively.
Figure 13:
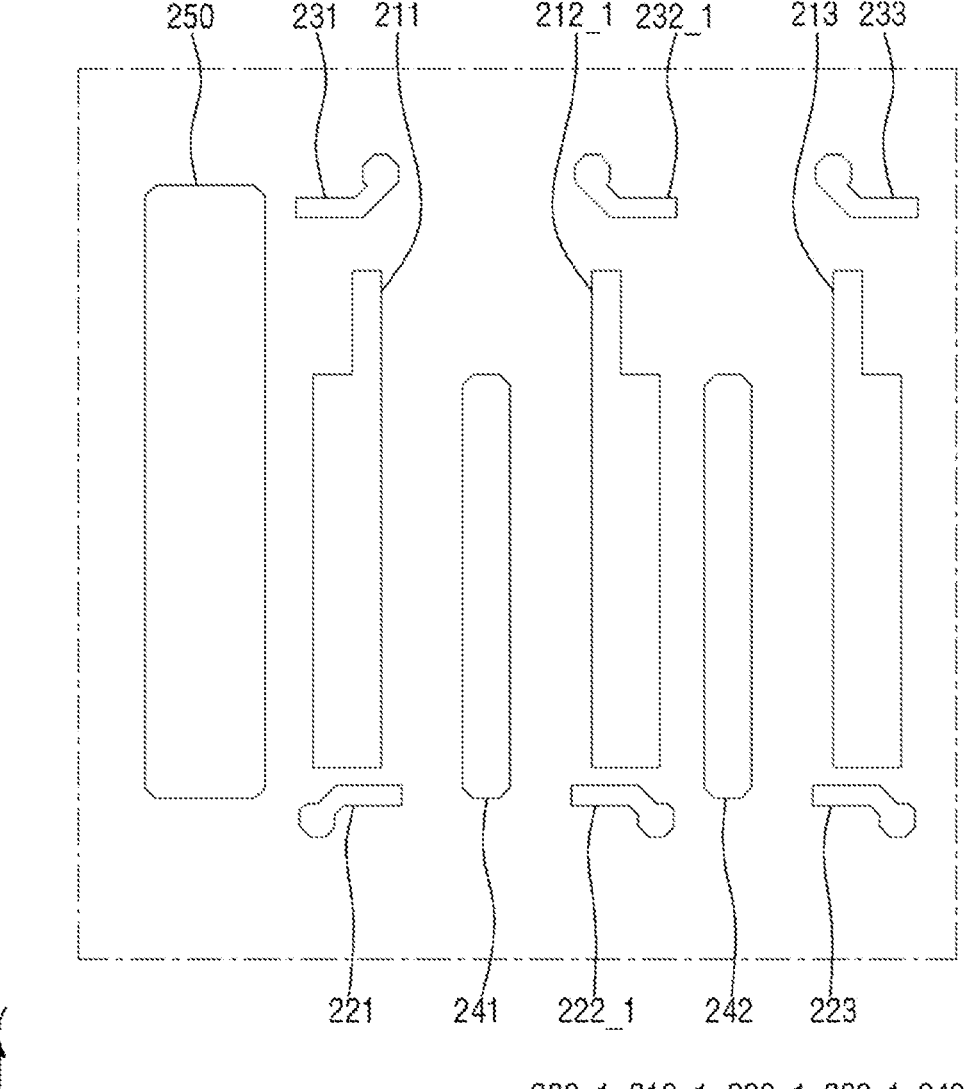
Figure 14:
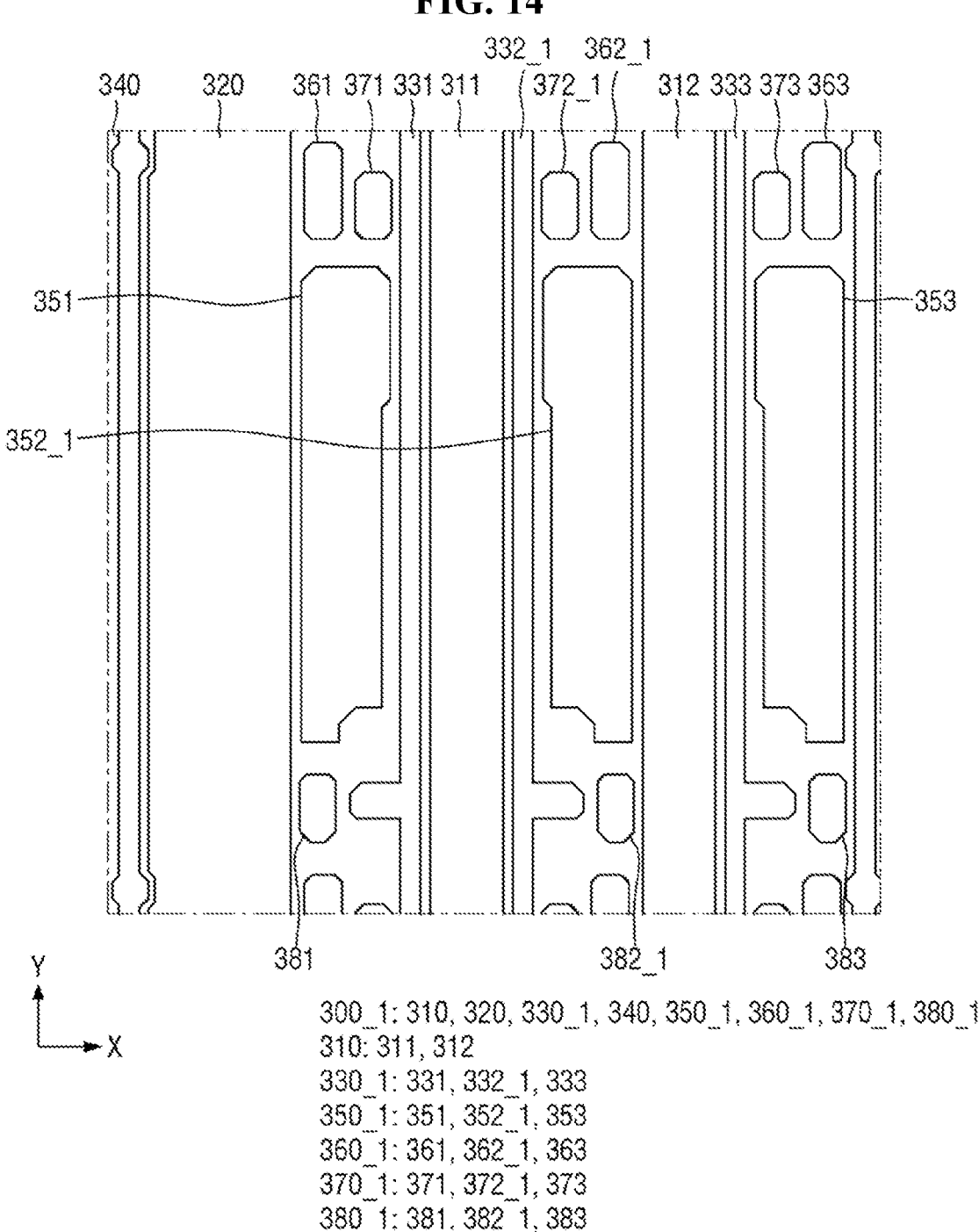

FIG. 11 is a view showing another embodiment of a layout of a plurality of lines disposed in a pixel of a display device according to the invention. FIGS. 12 to 14 are plan views showing some of the plurality of lines of FIG. 11, respectively.

Referring to FIGS. 11 to 14, a display device 10_1 according to this embodiment is different from the display device 10 according to the above embodiment in that a first supply voltage supplied from a first power line 311 disposed adjacent to a second power line 320 is applied to a first sub-pixel SPX1 and a second sub-pixel SPX2, and a first supply voltage supplied from a second power line 312 is applied to a third sub-pixel SPX3.

According to this embodiment, the shape of various patterns forming the second sub-pixel SPX2 may be substantially identical to the shape of various patterns forming the third sub-pixel SPX3.

In addition, a first semiconductor pattern ACT1_1 may partially overlap a first power line 311, a first data line 331 and a second data line 332_1. A second semiconductor pattern ACT2_1 may partially overlap a second power line 312 and a third data line 333.

According to this embodiment, a seventh semiconductor pattern ACT7_1 may have the same shape as an eighth semiconductor pattern ACT8 in the plan view. In addition, a fourth semiconductor pattern ACT4_1 may have the same shape as that of the fifth semiconductor pattern ACT5 in the plan view.

According to this embodiment, the distance from a first subsidiary bottom metal pattern 171 to the third semiconductor pattern ACT3 in the plan view may be substantially equal to the distance from the first subsidiary bottom metal pattern 171 to the fourth semiconductor pattern ACT4_1 in the plan view. The distance from the first subsidiary bottom metal pattern 171 to the sixth semiconductor pattern ACT6 in the plan view may be substantially equal to the distance from the first subsidiary bottom metal pattern 171 to the seventh semiconductor pattern ACT7_1 in the plan view.

In an embodiment, a second conductive layer 200_1 may include a first gate conductive pattern 210_1, second gate conductive pattern 220_1, third gate conductive pattern 230_1, and first and second overlapping conductive patterns 240 and 250. According to this embodiment, a fourth gate electrode 221 and a fifth gate electrode 222_1 may be disposed with a first subsidiary overlapping conductive pattern 241 therebetween. The shape of the fifth gate electrode 222_1 may be substantially identical to the shape of the sixth gate electrode 223 in the plan view. In addition, the shape of the eighth gate electrode 232_1 may be substantially identical to the shape of the ninth gate electrode 233 in the plan view. In an embodiment, the first gate conductive pattern 210_1 may include a second gate electrode 212_1 disposed between a first gate electrode 211 and a third gate electrode 213.

The first power line 311 may be disposed between the first data line 331 and the second data line 332_1, and the distance from the first power line 311 to the first data line 331 may be equal to the distance from the first power line 311 to the second data line 332_1.

According to this embodiment, the second data line 332_1, a second subsidiary connection electrode 382_1, a fifth subsidiary connection electrode 372_1 and an eighth subsidiary connection electrode 362_1 may have the same shape as that of the third data line 333, the third subsidiary connection electrode 383, the sixth subsidiary connection electrode 373 and the ninth subsidiary connection electrode 363, respectively, in the plan view.

In the display device 10_1 in the embodiment of the invention, the first power line 310 in one pixel PX includes the first power line 311 supplying the first supply voltage to the first sub-pixel SPX1 and the second power line 312 supplying the first supply voltage to the second sub-pixel SPX2 and the third sub-pixel SPX3, so that the area of the openings exposing the pixel electrodes PXE1, PXE2 and PXE3 may be increased in the display device 10_1 including the sub-pixels SPX1, SPX2 and SPX3 arranged in a stripe pattern. In this manner, it is possible to improve the luminous efficiency of the display device 10_1.

In addition, according to this embodiment, the same first supply voltage may be applied to the first and side sub-pixels SPX1 and SPX2 disposed adjacent to the second power line 320 through the first power line 311, the area of the openings exposing the first and second pixel electrodes PXE1 and PXE2 may be equally obtained in the display device 10_1.

What is claimed is:

1. A display device comprising:
   a substrate;
   a plurality of data lines including a first data line, a second data line and a third data line on the substrate, each of the first to third data lines extending in a first direction and arranged in a second direction crossing the first direction, the second data line being immediately adjacent to the first data line among the plurality of data lines, and the third data line being immediately adjacent to the second data line among the plurality of data lines;
   a first power line which is between the first data line and the second data line on the substrate, extends in the first direction, and supplies a first supply voltage;
   a second power line which is between the second data line and the third data line on the substrate, extends in the first direction, and supplies a second supply voltage equal to the first supply voltage;
   a plurality of sub-pixels including:
      a first sub-pixel which is directly connected to the first power line and the first data line among the first and second power lines and the first to third data lines;
      a second sub-pixel which is directly connected to the second power line and the second data line among the first and second power lines and the first to third data lines; and
      a third sub-pixel which is directly connected to the second power line and the third data line among the first and second power lines and the first to third data lines,
   wherein the first to third sub-pixels are sequentially arranged in the second direction so that each of the first to third sub-pixels does not overlap at least one of the first and second power lines.

2. The display device of claim 1, wherein a first distance from the second power line to the second data line in the second direction is equal to a second distance from the second power line to the third data line in the second direction.

3. The display device of claim 2, wherein a third distance from the first power line to the first data line in the second direction is equal to the first distance.

4. The display device of claim 3, wherein a fourth distance from the first power line to the second data line in the second direction is greater than the first distance.

5. The display device of claim 1, further comprising:
   a semiconductor layer comprising a plurality of semiconductor patterns disposed on the substrate;
   a first conductive layer on the semiconductor layer and comprising a plurality of gate electrodes at least partially overlapping some of the plurality of semiconductor patterns; and
   a second conductive layer on the first conductive layer and comprising the first data line, the second data line, the third data line, the first power line and the second power line.

6. The display device of claim 5, wherein the first data line, the second data line and the third data line are arranged adjacent to each other in order, and
   wherein the first data line, the second data line and the third data line partially overlap some of the plurality of semiconductor patterns.

7. The display device of claim 6, wherein the plurality of semiconductor patterns comprises:
   a first semiconductor pattern partially overlapping the first data line; and

27 a second semiconductor pattern partially overlapping the second data line and the third data line, wherein the first semiconductor pattern partially overlaps the first power line, and wherein the second semiconductor pattern partially overlaps the second power line.

8. The display device of claim 5, wherein the plurality of gate electrodes comprises:

a first gate electrode to which a first side of the first data line faces in a direction opposite to the second direction;

a second gate electrode disposed between a second side of the first data line opposite to the first side of the first data line and a first side of the second data line; and a third gate electrode to which a second side of the second data line opposite to the first side of the second data line faces in the second direction.

9. The display device of claim 8, wherein a first separation distance between the second gate electrode and the second power line in the second direction in a plan view is equal to a second separation distance between the third gate electrode and the second power line in the second direction in the plan view.

10. The display device of claim 9, wherein a third separation distance between the first gate electrode and the first power line in the second direction is equal to the first separation distance in the plan view.

11. The display device of claim 8, further comprising a plurality of pixel electrodes on the second conductive layer, the plurality of pixel electrodes comprising:

a first pixel electrode partially overlapping the first gate electrode;

a second pixel electrode partially overlapping the second gate electrode; and a third pixel electrode partially overlapping the third gate electrode.

12. The display device of claim 11, wherein the second supply voltage from the second power line is applied to the second pixel electrode and the third pixel electrode, and wherein the first supply voltage from the first power line is applied to the first pixel electrode.

13. The display device of claim 1, further comprising a power line on the substrate on a side opposite to the first power line with the first data line therebetween, wherein a third supply voltage lower than the first supply voltage is applied to the power line.

* * * * *